(12) United States Patent
Li et al.

(10) Patent No.: US 12,302,501 B2
(45) Date of Patent: May 13, 2025

(54) CURVED DISPLAY MODULE AND DISPLAY DEVICE

(71) Applicants: Beijing BOE Display Technology Co., Ltd., Beijing (CN); BOE TECHNOLOGY GROUP CO., LTD., Beijing (CN)

(72) Inventors: Huiyan Li, Beijing (CN); Yu Zhang, Beijing (CN); Shixin Geng, Beijing (CN); Lijin Zhao, Beijing (CN); Guangyun Tong, Beijing (CN); Xu Chen, Beijing (CN)

(73) Assignees: Beijing BOE Display Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 142 days.

(21) Appl. No.: 18/016,055

(22) PCT Filed: Aug. 4, 2021

(86) PCT No.: PCT/CN2021/110619
§ 371 (c)(1),
(2) Date: Jan. 13, 2023

(87) PCT Pub. No.: WO2022/068381
PCT Pub. Date: Apr. 7, 2022

(65) Prior Publication Data
US 2023/0292442 A1 Sep. 14, 2023

(30) Foreign Application Priority Data
Sep. 30, 2020 (CN) .......................... 202011063526.6

(51) Int. Cl.
*H05K 1/18* (2006.01)
*H05K 7/14* (2006.01)
(Continued)

(52) U.S. Cl.
CPC ........... *H05K 1/189* (2013.01); *H05K 7/1454* (2013.01); *H05K 7/18* (2013.01); *G02F 1/133305* (2013.01); *H05K 2201/10136* (2013.01)

(58) Field of Classification Search
CPC ........ H05K 1/189; H05K 7/1454; H05K 7/18; H05K 2201/10136; G02F 1/133305
(Continued)

(56) References Cited

U.S. PATENT DOCUMENTS

2015/0192731 A1  7/2015  Kim et al.
2016/0219732 A1*  7/2016  Cho ...................... G02F 1/1333
(Continued)

FOREIGN PATENT DOCUMENTS

CN  101464572 A  6/2009
CN  201636705 U  11/2010
(Continued)

*Primary Examiner* — Binh B Tran
(74) *Attorney, Agent, or Firm* — HOUTTEMAN LAW, LLC

(57) ABSTRACT

A curved display module and a display device, where the curved display module includes a back plate, a display panel and a display panel circuit board. The back plate includes a bottom plate and a side plate, where the side plate is at an outer periphery of the bottom plate, the bottom plate and the side plate together define an accommodating space to accommodate a backlight assembly, the display panel is on a side of the backlight assembly away from the bottom plate, the display panel circuit board is electrically connected to the display parcel through a flexible circuit board, and the display panel circuit board is at an outer side of the side plate.

19 Claims, 34 Drawing Sheets

(51) Int. Cl.
*H05K 7/18* (2006.01)
*G02F 1/1333* (2006.01)
(58) Field of Classification Search
USPC .......................................... 361/749
See application file for complete search history.

(56) References Cited

U.S. PATENT DOCUMENTS

2019/0187506 A1* 6/2019 Yun .................. G02F 1/13452
2023/0206797 A1* 6/2023 Shin .................... G09G 3/03
                                                              361/679.01

FOREIGN PATENT DOCUMENTS

| CN | 102034401 A | 4/2011 |
| CN | 104766547 A | 7/2015 |
| CN | 105842890 A | 8/2016 |
| CN | 106340248 A | 1/2017 |
| CN | 108257507 A | 7/2018 |
| CN | 109036124 A | 12/2018 |
| CN | 208239761 U | 12/2018 |
| CN | 111243448 A | 6/2020 |
| CN | 111638609 A | 9/2020 |
| CN | 212410981 U | 1/2021 |

* cited by examiner

CURVED DISPLAY MODULE AND DISPLAY DEVICE

CROSS-REFERENCE TO RELATED APPLICATIONS

This is a National Phase Application filed under 35 U.S.C. 371 as a national stage of PCT/CN2021/110619, filed on Aug. 4, 2021, claiming the Chinese Patent Application No. 202011063526.6 filed on Sep. 30, 2020, the content of each of which is incorporated herein by reference in its entirety.

TECHNICAL FIELD

The present disclosure relates to the technical field of display, and in particular to a curved display module and a display device.

BACKGROUND

At present, the conventional display module is of a flat display framework. With the development of display technology and the pursuit of people for innovative display effect, the diversified display forms of the module need to be considered. A curved display accords with the ergonomic design better, and the display effect with more real visual angles may be presented.

However, the curved display module in the related art, especially the large-sized curved display module, cannot satisfy the requirement on the curvature with a high precision due to the structural design limitations thereof.

SUMMARY

The present disclosure aims at solving at least one of the technical problems found in related art. To this end, an aim of this application is to provide a curved display module, and the curved display module can satisfy requirements on a curvature with a high precision and reduce a risk of tearing of a flexible circuit board connected between a display panel and a display panel circuit board.

The present disclosure further provides a display device with the curved display module.

A curved display module according to an embodiment of a first aspect of the present disclosure includes: a back plate, where the back plate includes a bottom plate and a side plate, the side plate is at an outer periphery of the bottom plate, and the bottom plate and the side plate together define an accommodating space to accommodate a backlight assembly; a display panel, where the display panel is on a side of the backlight assembly away from the bottom plate; and a display panel circuit board, where the display panel circuit board is electrically connected to the display panel through a flexible circuit board, and the display panel circuit board is at an outer side of the side plate.

In the curved display module according to the embodiment of the present disclosure, through arranging the display panel circuit board at the outer side of the side plate, an influence of the display panel circuit board on the curvature of the module can be significantly reduced, the requirements on the curvature with a high precision can be satisfied, and a yield of the subsequent process can also be ensured. Moreover, the risk of tearing of the flexible circuit board connected between the display panel and the display panel circuit board can be reduced.

According to some embodiments of the present disclosure, the display panel circuit board is fixedly connected to the side plate which is arc-shaped, and the bottom plate is arc-shaped.

According to some embodiments of the present disclosure, the side plate includes: a support part, where the support part is at the outer periphery of the bottom plate, and the support part and the bottom plate together define the accommodating space; and a circuit board fixing part, where the circuit board fixing part is connected to an outer side of the support part, at least a part of the circuit board fixing part is spaced apart from the support part, and the display panel circuit board is at an outer side of the circuit board fixing part and connected to the circuit board fixing part.

In some alternative embodiments of the present disclosure, the support part includes: a first support sub-part, where one end of the first support sub-part is connected to the bottom plate, the other end of the first support sub-part extends in a direction approaching the display panel, the circuit board fixing part is at an outer side of the first support sub-part, and the circuit board fixing part and the first support sub-part are opposite to and spaced apart from each other; and a second support sub-part, where one end of the second support sub-part is connected to the other end of the first support sub-part, and the other end of the second support sub-part extends outwards and is connected to the circuit board fixing part.

Further, the curved display module further includes a backlight assembly, the backlight assembly includes a second optical film, a positioning pillar is on a side of the second support sub-part close to the display panel, and a positioning hole matching the positioning pillar is in the second optical film.

According to some embodiments of the present disclosure, the curved display module includes a first protective cap, where at least a part of the first protective cap is at the outer side of the side plate and covers the display panel circuit board.

In some alternative embodiments of the present disclosure, the curved display module includes a middle frame, where at least a part of the middle frame is on a side of the back plate close to the display panel, the display panel is on the middle frame, the first protective cap includes a protective part and a first flanging, the protective part is at the outer side of the side plate and/or an outer side of the middle frame, the first flanging is at a side of the protective part close to the display panel, and the first flanging abuts against a surface of the middle frame close to the display panel.

Further, the first protective cap further includes a second flanging, the second flanging is at a side of the protective part away from the display panel, and the second flanging abuts against a surface of the back plate away from the display panel.

According to some embodiments of the present disclosure, a first fixing hole is in the side plate, a second fixing hole corresponding to the first fixing hole is in the display panel circuit board, and a fastener passes through the first fixing hole and the second fixing hole to connect the display panel circuit board to the back plate.

In some alternative embodiments of the present disclosure, the first fixing hole is in the circuit board fixing part.

In some alternative embodiments of the present disclosure, a positioning boss for positioning the display panel circuit board is on the side plate, the positioning boss is around an outer periphery of the first fixing hole, and the positioning boss matches the second fixing hole.

In some alternative embodiments of the present disclosure, the curved display module includes a first protective cap, where at least a part of the first protective cap is at the outer side of the side plate and covers the display panel circuit board, a third fixing hole is in the first protective cap, and a fastener passes through the first fixing hole, the second fixing hole and the third fixing hole to connect the display panel circuit board and the first protective cap to the back plate.

According to some embodiments of the present disclosure, the curved display module further includes a backlight assembly, the backlight assembly including a light source component and a reflector, the light source component is on the bottom plate, the reflector includes a first reflective part and a second reflective part, the first reflective part is on the light source component and on a side of the light source component away from the bottom plate, and the second reflective part is on the side plate.

According to some embodiments of the present disclosure, the curved display module includes a chip on film assembly, where the chip on film assembly is at the outer side of the side plate and serves for transmitting a driving signal to the display panel.

In some alternative embodiments of the present disclosure, the chip on film assembly includes a source-chip on film, and the source-chip on film and the display panel circuit board are on a same side of the side plate.

Further, the curved display module includes a second protective cap, where the second protective cap is at the outer side of the side plate and covers the source-chip on film.

Alternatively, the curved display module includes a first protective cap, where the first protective cap is at the outer side of the side plate and covers the display panel circuit board, and the second protective cap and the first protective cap are a same protective cap.

Alternatively, a spacer is between the second protective cap and the source-chip on film.

In some alternative embodiments of the present disclosure, the chip on film assembly includes a gate-chip on film, and the gate-chip on film and the display panel circuit board are on different sides of the side plate, respectively.

Further, the curved display module includes a third protective cap, where the third protective cap is at the outer side the side plate and covers the gate-chip on film.

In some alternative embodiments of the present disclosure, the curved display module includes a middle frame, where the middle frame is on a side of the back plate close to the display panel, the display panel is on the middle frame, the chip on film assembly is at an outer side of the middle frame, and the middle frame is provided with an avoiding hole for avoiding the chip on film assembly.

According to some embodiments of the present disclosure, the curved display module includes a middle frame, where the middle frame is on a side of the back plate close to the display panel, the display panel and the middle frame are connected together through a foam tape, and the middle frame is provided with a positioning groove for accommodating the foam tape.

According to some embodiments of the present disclosure, the backlight assembly includes a light source component, the light source component is on the bottom plate, the light source component includes a plurality of light bars, the plurality of light bars are arranged at intervals in an up-down direction, and each of the plurality of light bars extends in a left-right direction.

In some alternative embodiments of the present disclosure, the light source component includes a light bar connector for controlling the light bar, a wiring hole for the light bar connector to be wired out in the side plate, the wiring holes, the light bar connectors and the light bars all have a same number and have a one-to-one correspondence, and each of the wiring holes is opposite to a corresponding light bar connector.

Alternatively, a part of the light bar connectors are at a left side of the corresponding light bar, and another part of the light bar connectors are at a right side of the corresponding light bar.

In some alternative embodiments of the present disclosure, the light bar includes a lamp panel and lamp beads on the lamp panel, and the lamp panel is made of an FPC base material or an FR4 base material.

In some alternative embodiments of the present disclosure, the bottom plate is provided with a contour reference for positioning the light bar.

According to some embodiments of the present disclosure, the display panel circuit board is at a ground side of the side plate.

According to some embodiments of the present disclosure, the backing plate is an aluminum alloy member or a magnesium alloy member.

According to some embodiments of the present disclosure, the back plate is a one-piece member.

Alternatively, the backing plate is a die cast.

A display device according to an embodiment of a second aspect of the present disclosure, includes the display module according to the embodiment of the first aspect of the present disclosure.

In the display device according to the embodiment of the present disclosure, through providing the curved display module described above, the requirements on the curvature with a high precision can be satisfied, and the yield of the subsequent process can also be ensured.

Additional aspects and advantages of the present disclosure will be set forth in part in the following description, will become apparent in part from the following description, or may be learned by practice of the present disclosure.

BRIEF DESCRIPTION OF DRAWINGS

The above and/or additional aspects and advantages of the present disclosure will become apparent and readily appreciated from the following description of the embodiment in conjunction with the accompanying drawings, in which.

Figure 1:
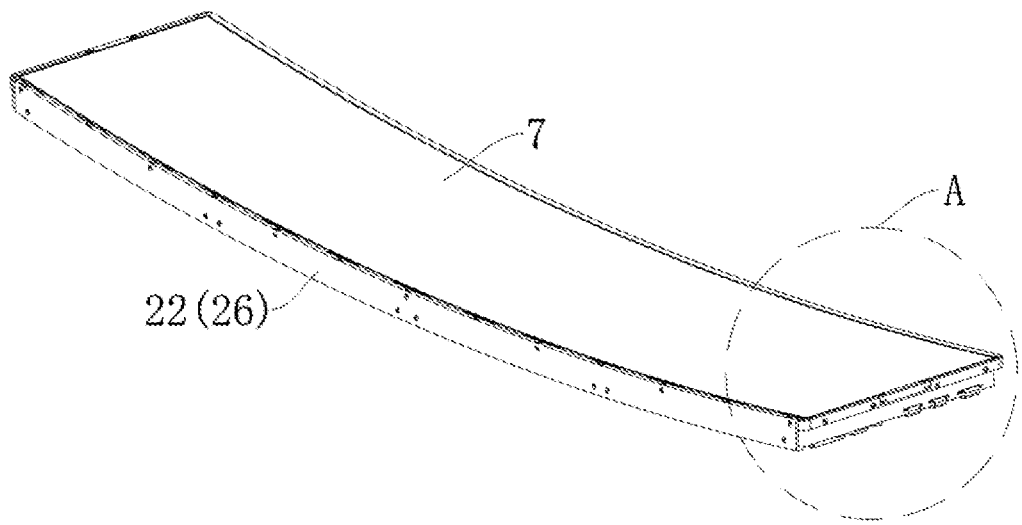
FIG. 1 is a perspective view of a curved display module according to some embodiments of the present disclosure.
Figure 2:
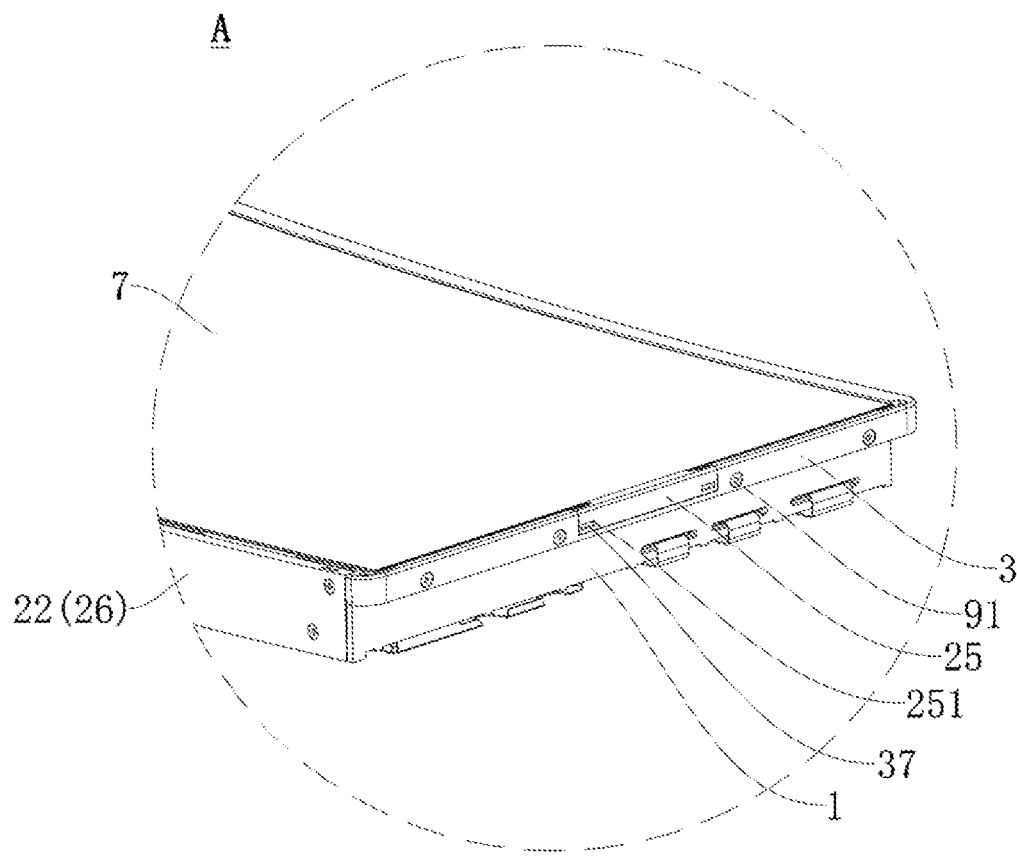
FIG. 2 is an enlarged view of a part A in FIG. 1.
Figure 3:
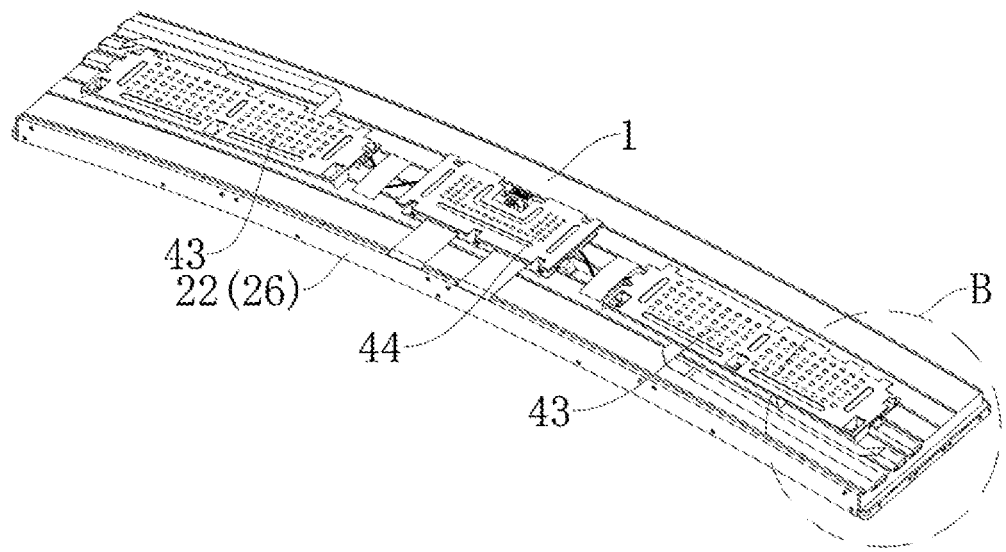
FIG. 3 is a perspective view of the curved display module in FIG. 1 from another viewpoint.
Figure 4:
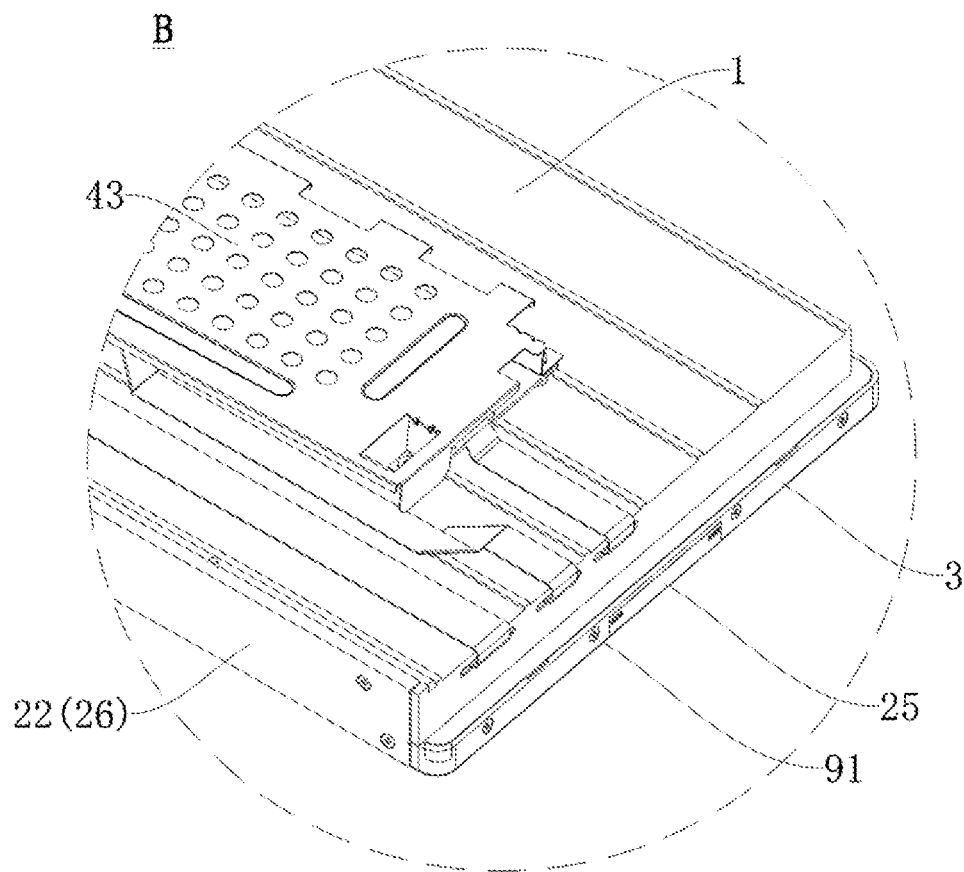
FIG. 4 is an enlarged view of a part B in FIG. 3.
Figure 5:
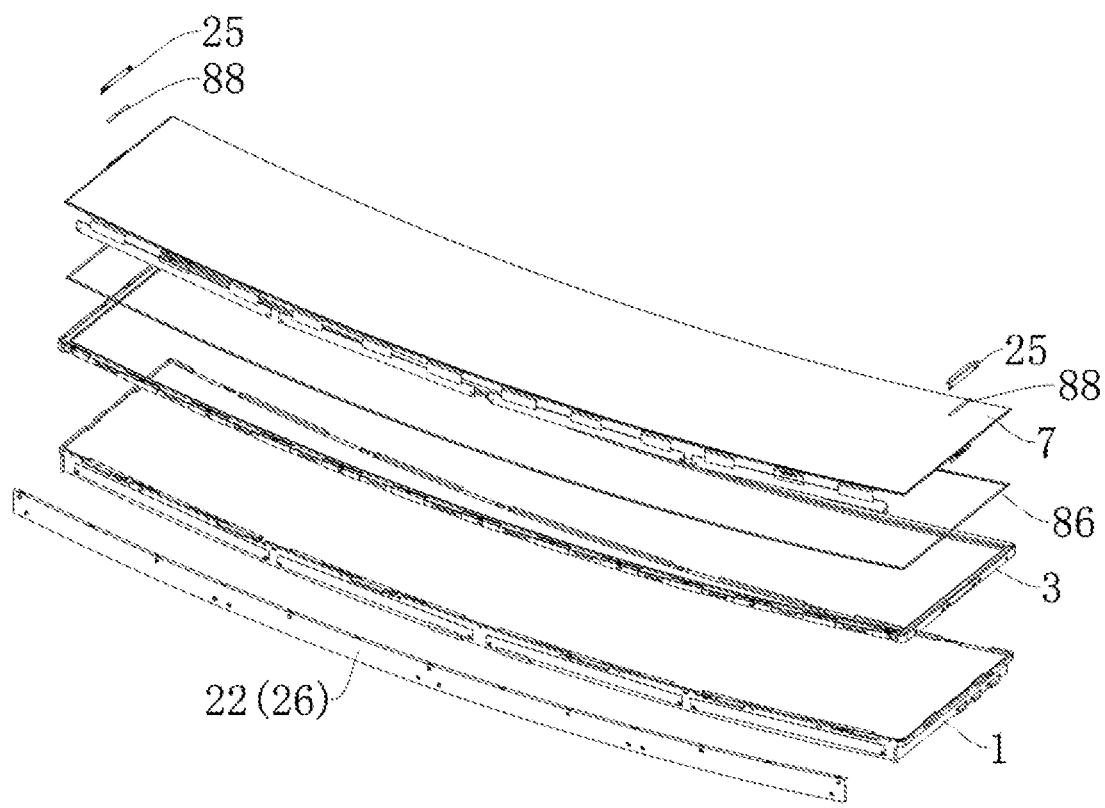
FIG. 5 is an exploded view of the curved display module in FIG. 1.
Figure 6:
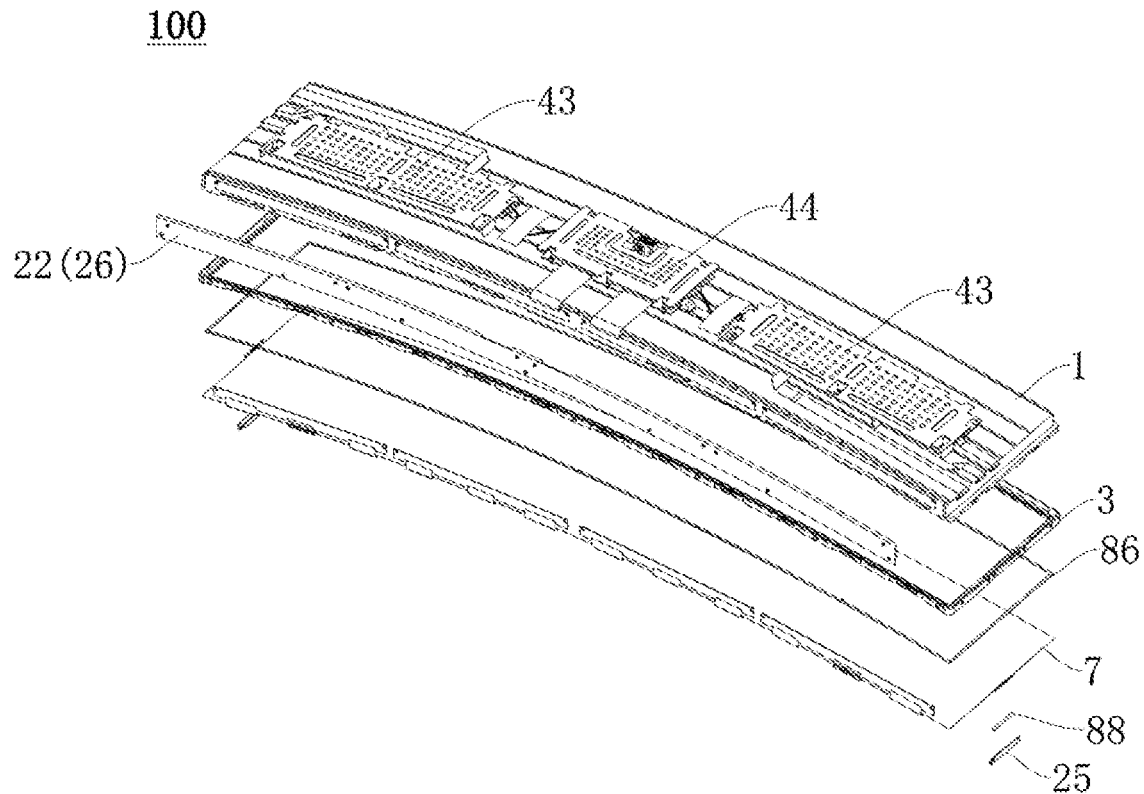
FIG. 6 is an exploded view of the curved display module in FIG. 1 from another viewpoint.
Figure 7:
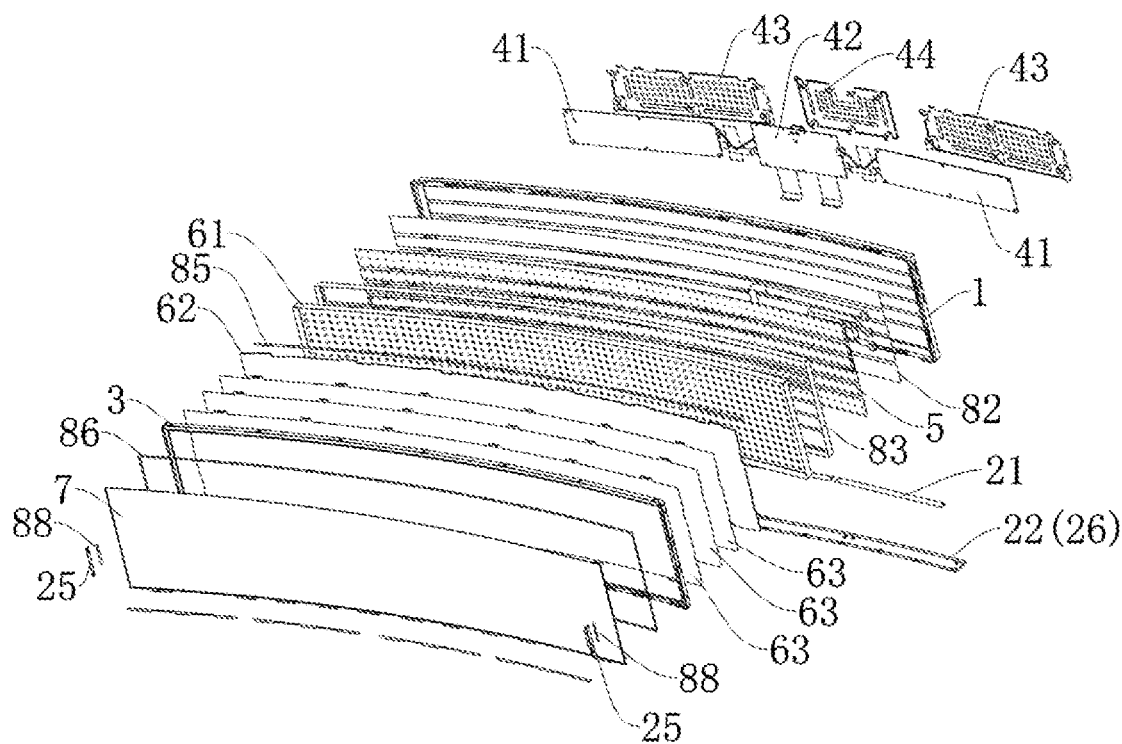
FIG. 7 is an exploded view of the curved display module in FIG. 1.
Figure 8:
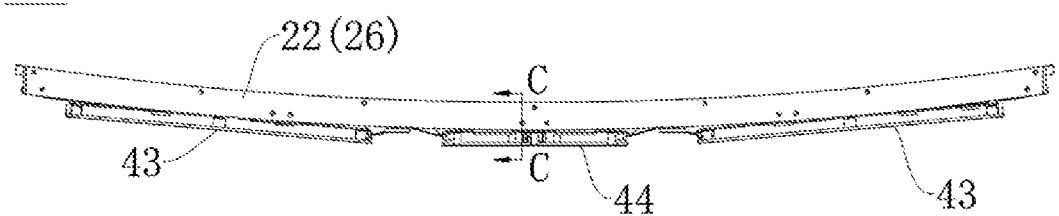
FIG. 8 is a bottom view of the curved display module in FIG. 1.

REFERENCE CHARACTERS a curved display module 100:
- a back plate 1; an accommodating space 10; a bottom plate 11; a reinforcing rib 111; a contour reference 112; a side plate 12; a support part 120; a first support sub-part 121; a second support sub-part 122; a middle frame fixing part 123; a second snap hook 1231; a positioning pillar 124; a wiring hole 125; a circuit board fixing part 13; a first fixing hole 131; a positioning boss 132;
- a display panel circuit board 21; a second fixing hole 211; a first protective cap 22; a protective part 221; a third fixing hole 2211; a first flanging 222; a first snap hole 2221; a second flanging 223; a source-chip on film 23; a source chip 231; a source film 232; a gate-chip on film 24; a gate chip 241; a third protective cap 25; a second snap hole 251; a second protective cap 26;
- a middle frame 3; a first avoiding hole 31; a second avoiding hole 32; an avoiding groove 33; a positioning groove 34; a first snap hook 35; a third snap hook 36; a fourth snap hook 37;
- a light source driving circuit board 41; a signal driving circuit board 42; a fourth protective cap 43; a fifth protective cap 44;
- a light source component 5; a light bar 51; a lamp panel 511; a lamp bead 512; a light bar connector 52; a reflector 61; a first reflective part 611; a second reflective part 612; a first optical film 62; a second optical film 63; a positioning hole 631;
- a display panel 7;
- a first adhesive layer 81; a second adhesive layer 82; a third adhesive layer 83; an avoiding opening 831; a fourth adhesive layer 84; a fifth adhesive layer 85; a foam tape 86; a spacer 87; a foam layer 88;
- a first fastener 91; a second fastener 92; a third fastener 93.

DETAIL DESCRIPTION OF EMBODIMENTS

Description will be made in detail below to embodiments of the present disclosure, examples of which are illustrated in the accompanying drawings, where same or similar reference characters refer to the same or similar elements or elements having the same or similar functions throughout. The embodiments described below with reference to the accompanying drawings are exemplary only for explaining the present disclosure and are not to be construed as limiting the present disclosure.

A curved display module 100 according to an embodiment of the present disclosure will be described with reference to FIGS. 1 to 57. The curved display module 100 may be used as a main body of a display device. For example, a protective cover plate (e.g., a glass cover plate) may be attached to the front of the curved display module 100, and a back housing of the complete machine may be assembled to the back of the curved display module 100, thereby forming the display device. The curved display module 100 may alternatively be directly embedded as an appearance piece. The curved display module 100 may be used for vehicle-mounted display, commercial display, household display or the like. Alternatively, the curved display module 100 may be a direct-lit curved display module.

As shown in FIGS. 1 to 10, the curved display module 100 according to an embodiment of the first aspect of the present disclosure includes a back plate 1, a backlight assembly, a display panel 7 and a display panel circuit board 21.

The display panel 7 may be arranged on a side of the back plate 1, for example, the display panel 7 is arranged on the front side of the back plate 1. The display panel 7 may be a liquid crystal display panel, and the back plate 1 may serve as a supporting structure to support other components of the curved display module 100. A cross section of the display panel 7 may be curved, for example, the cross section of the display panel 7 is formed into an arc shape protruding towards the back. A cross section of the back plate 1 may also be curved, for example, the cross section of the back plate 1 is formed into an arc shape protruding towards the back. The shapes of the display panel 7 and the back plate 1 match each other.

The back plate 1 includes a bottom plate 11 and a side plate 12. A cross section of the bottom plate 11 may be curved, for example, the cross section of the bottom plate 11 is formed into an arc shape protruding towards the back. The side plate 12 is formed at an outer periphery of the bottom plate 11, the side plate 12 may surround the bottom plate 11, and the side plate 12 is located on a side of the bottom plate 11 close to the display panel 7. The bottom plate 11 and the side plate 12 may be arranged substantially perpendicular to each other. The bottom plate 11 and the side plate 12 together define an accommodating space 10 adapted to accommodating the backlight assembly. The backlight assembly is arranged in the accommodating space 10 defined by the bottom plate 11 and the side plate 12 together. The display panel 7 is arranged on a side of the backlight assembly away from the bottom plate 11, for example, the display panel 7 is arranged on a front side of the backlight assembly. The backlight assembly may provide a light source for the display panel 7. For example, where the display panel 7 is a liquid crystal display panel, the backlight assembly may provide a light source for the display panel 7.

Alternatively, the display panel 7 may be a liquid crystal display panel. The liquid crystal display panel may include a first substrate and a second substrate that are opposite to and spaced apart from each other. A liquid crystal layer is arranged between the first substrate and the second substrate. A thin film transistor and a color filter are provided on a side of the first substrate close to the liquid crystal layer and a side of the second substrate close to the liquid crystal layer, respectively. A first polarizer is provided on a side of the first substrate away from the liquid crystal layer, and a second polarizer is provided on a side of the second substrate away from the liquid crystal layer.

The display panel circuit board 21 is electrically connected to the display panel 7. The display panel circuit board 21 is arranged at an outer side of the side plate 12, where the outer side of the side plate 12 refers to a side of the side plate 12 away from the accommodating space 10. For example, the display panel circuit board 21 may be arranged on a ground side of the side plate 12 (the ground side of the side plate 12 refers to a downward side of the side plate 12 when the curved display module 100 is in use). The display panel circuit board 21 may alternatively be arranged on a sky side of the side plate 12 (the sky side of the side plate 12 refers to an upward side of the side plate 12 when the curved display module 100 is in use). The display panel circuit board 21 may alternatively be arranged on a left side of the side plate 12 or a right side of the side plate 12.

Alternatively, the display panel circuit board 21 may be a PCB. The display panel circuit board 21 and the display panel 7 may be connected by a flexible circuit board, which has good bending property, so that an electrical connection between the display panel circuit board 21 and the display panel 7 may be realized easily.

Alternatively, the display panel circuit board 21 is fixedly connected to the side plate 12, so that the display panel circuit board 21 may be reliably and stably installed on the side plate 12. The side plate 12, to which the display panel circuit board 21 is fixedly connected, may be arc shaped. The side plate 12 being arc shaped means that the side plate 12 extends in an arc shape in the left-right direction. The bottom plate 11 may be arc shaped, and the bottom plate 11 being arc shaped means that the bottom plate 11 extends in an arc shape in the left-right direction. Being fixedly connected may define a relative displacement in at least one direction.

It should be noted that, the directions "up, down, front, back, left, and right" described in the present disclosure are all relative to the user using the curved display module. An orientation of the curved display module facing the user is the front, otherwise an orientation of the curved display module away from the user is the back.

Through arranging the display panel circuit board 21 at the outer side of the side plate 12, compared with arranging the display panel circuit board 21 at the back side of back plate 1, an influence of the display panel circuit board 21 on the curvature of the module can be significantly reduced, the requirements on the curvature with a high precision can be satisfied, and the yield of the subsequent process can also be ensured. Further, a risk of tearing of the flexible circuit board connected between the display panel circuit board 21 and the display panel 7 can be reduced.

For example, where the display panel circuit board 21 is arranged at the back side of the back plate 1, the flexible circuit board connected between the display panel circuit board 21 and the display panel 7 needs to be bent at least twice. For example, the flexible circuit board connected between the display panel circuit board 21 and the display panel 7 is U-shaped. Where the display panel circuit board 21 is arranged at the outer side of the side plate 12, the flexible circuit board connected between the display panel circuit board 21 and the display panel 7 may be bent only once. For example, the flexible circuit board connected between the display panel circuit board 21 and the display panel 7 is L-shaped. Thus, through arranging the display panel circuit board 21 at the outer side of the side plate 12, the bending times, the flexible circuit board connected between the display panel circuit board 21 and the display panel 7 is bent, are reduced as compared with arranging the display panel circuit board 21 at the back side of the back plate 1, so that the risk of tearing of the flexible circuit board connected between the display panel circuit board 21 and the display panel 7 can be reduced.

Further, the bottom plate 11 may be arc shaped, for example, the bottom plate 11 is formed into an arc protruding towards the back. The side plate 12, to which the display panel circuit board 21 is fixedly connected, may be arc shaped. Where the display panel circuit board 21 is arranged at the back side of the back plate 1, a part of the flexible circuit board connected between the display panel circuit board 21 and the display panel 7, which is located at the back side of the bottom plate 11, extends in an arc shape, so that the part of the flexible circuit board, which is located at the back side of the bottom plate 11, is subjected to a large tensile stress, which easily causes a tearing of the part of the flexible circuit board, which is located at the back side of the bottom plate 11, and also causes a tearing of a connection point between the flexible circuit board and the display panel circuit board 21. In the present disclosure, the display panel circuit board 21 is arranged at the outer side of the side plate 12, so that the part of the flexible circuit board connected between the display panel circuit board 21 and the display panel 7, which located at the back side of the bottom plate 11, is eliminated, stress on the flexible circuit board is reduced, and the risk of tearing of the flexible circuit board connected between the display panel circuit board 21 and the display panel 7 is further reduced. Further, the connection point between the flexible circuit board and the display panel circuit board 21 is located on the side plate 12, and the risk of tearing of the connection point between the flexible circuit board and the display panel circuit board 21 is also reduced.

Moreover, through setting the back plate 1 to include the bottom plate 11 and the side plate 12, and through arranging the backlight assembly in the accommodating space 10 defined by the bottom plate 11 and the side plate 12 together, the side plate 12 may serve as a bearing structure for a part of the structure of the backlight assembly, and a separate housing structure for installing and fixing the part of the structure of the backlight assembly may be omitted, for example, a lower housing in the related art may be omitted, so that the back plate 1 has both functions of the back plate 1 itself and the lower housing in the related art, thereby further reducing factors interfering the curvature of the module, and also reducing the manufacturing cost.

The curvature precision in statistical tolerance of the curved display module 100 of the present disclosure may reach 2.5%, for example, where the curvature radius of the curved display module 100 of the present embodiment is 4200 mm, the statistical tolerance is ±1 mm. The curvature precision in statistical tolerance of the curved display module in the related art may only reach 4.5%, for example, where the curvature radius of the curved display module in the related art is 4200 mm, the statistical tolerance is ±2 mm at the lowest. Therefore, the curvature precision in statistical tolerance of the curved display module 100 is obviously improved, and an occasion requiring the curvature with a higher precision may be met. For example, when it is subsequently required that a protective cover plate (e.g., a glass cover plate) is attached to the front of the curved display module 100 and a back housing of the complete machine is assembled to the back of the curved display module 100, so as to form the display device, the curved display module 100 may meet the requirements on the curvature with a high precision, and thus the functional requirements of the subsequent assembly of the complete machine and the visual requirements of seamless appearance may be met. For another example, when the curved display module 100 is embedded as an appearance piece, subsequent embedding assembly can be facilitated, and the visual requirement of seamless appearance can be realized.

In the curved display module 100 according to the embodiment of the present disclosure, through arranging the display panel circuit board 21 at the outer side of the side plate 12, the influence of the display panel circuit board 21 on the curvature of the module can be significantly reduced, the requirements on the curvature with a high precision can be satisfied, and the yield of the subsequent process can also be ensured. Further, the risk of tearing of the flexible circuit board connected between the display panel circuit board 21 and the display panel 7 can be reduced.

According to some embodiments of the present disclosure, referring to FIGS. 1 to 10, the display panel circuit board 21 may be arranged on a ground side of the side plate 12, where the ground side of the side plate 12 refers to a downward side of the side plate 12 when the curved display module 100 is in use. Thus, a space at the ground side of the side plate 12 may be fully utilized, to install and fix the display panel circuit board 21 at the ground side of the side plate 12. Further, the installation is easy at this position, the space is comparatively sufficient, and the assembly requirement of the display panel board 21 can be satisfied. Further, the influence of the display panel circuit board 21 on the curvature of the module can be significantly reduced, the requirements on the curvature with a high precision can be satisfied, and the yield of the subsequent process can also be ensured. Where the display panel circuit board 21 is installed at the ground side of the side plate 12, the shape of the display panel circuit board 21 may match the shape of the ground side of the side plate 12.

According to some embodiments of the present disclosure, referring to FIGS. 9 to 26, 39 and 40, the side plate 12 includes a support part 120 and a circuit board fixing part 13. The support part 120 is formed at an outer periphery of the bottom plate 11, the support part 120 may surround the bottom plate 11, and the support part 120 and the bottom plate 11 together define the accommodating space 10. The circuit board fixing part 13 is connected to the outer side of the side plate 12. At least a part of the circuit board fixing part 13 is spaced apart from the support part 120, and the circuit board fixing part 13 may be arranged substantially parallel to at least a part of the support part 120. The display panel circuit board 21 is arranged at an outer side of the circuit board fixing part 13 (the outer side of the circuit board fixing part 13 refers to a side of the circuit board fixing part 13 away from the accommodating space 10), and the display panel circuit board 21 is connected to the circuit board fixing part 13.

Through setting the back plate 1 to include the bottom plate 11 and the side plate 12, and setting the side plate 12 to include the support part 120 and the circuit board fixing part 13, and through arranging the backlight assembly in the accommodating space 10 defined by the bottom plate 11 and the support part 120 together, the support part 120 may serve as a bearing structure for a part of the structure of the backlight assembly, and an additional separately arranged middle frame structure for installing and fixing the part of the structure of the backlight assembly may be omitted, for example, a lower housing in the related art may be omitted, so that the back plate 1 has both functions of the back plate 1 itself and the lower housing in the related art, thereby further reducing the factors interfering the curvature of the module, and also reducing the manufacturing cost. Moreover, by arranging the circuit board fixing part 13 at the outer side of the support part 120, a double-wall structure is formed at the outer side of the back plate 1, so that a part of the structure of the backlight assembly may be installed and fixed on an inner wall (i.e., a part of the support part 120, for example, where the circuit board fixing part 13 is arranged at the ground side of the support part 120, a part of the support part 120 located at the ground side of the back plate 1 is the inner wall), and the display panel circuit board 21 may be installed and fixed on an outer wall (i.e., the circuit board fixing part 13), which not only omits a lower housing in the related art, but also facilitates the installation and fixation of the display panel circuit board 21.

In some alternative embodiments of the present disclosure, referring to FIGS. 9-26, 39 and 40, the support part 120 includes a first support sub-part 121 and a second support sub-part 122. One end of the first support sub-part 121 is connected to the bottom plate 11, and the other end of the first support sub-part 121 extends in a direction approaching the display panel 7. The first support sub-part 121 may be arranged perpendicular to the bottom plate 11. The circuit board fixing part 13 is located at an outer side of the first support sub-part 121 (the outer side of the first support sub-part 121 refers to a side of the first support sub-part 121 away from the accommodating space 10), the circuit board fixing part 13 is arranged opposite to and spaced apart from the first support sub-part 121, and the circuit board fixing part 13 and the first support sub-part 121 may be arranged parallel to each other.

One end of the second support sub-part 122 is connected to the other end of the first support sub-part 121, the other end of the second support sub-part 122 extends in an outward direction (the outward direction is a direction away from the accommodating space 10), and the other end of the second support sub-part 122 is connected to the circuit board fixing part 13. The second support sub-part 122 may be arranged perpendicular to both the first support sub-part 121 and the circuit board fixing part 13, the second support sub-part 122 may be arranged substantially parallel to the bottom plate 11, and the second support sub-part 122 may serve for connecting the first support sub-part 121 and the circuit board fixing part 13 together, so that one side of the back plate 1 (for example, the ground side of the back plate 1) forms a double-wall structure. Through setting the support part 120 to include the first support sub-part 121 and the second support sub-part 122 described above, the support and fixation of a part of the structure of the backlight assembly can be conveniently achieved.

For example, in some specific examples of the present disclosure, referring to FIGS. 9 to 26, 39, and 40, the backlight assembly includes a light source component 5, a reflector 61, and a first optical film 62. The light source component 5 is arranged on the bottom plate 11, the light source component 5 may be fixed on the bottom plate 11 through a second adhesive layer 82, the second adhesive layer 82 may be a double-sided adhesive layer, and the light source component 5 may provide a light source for the display panel 7. The reflector 61 includes a first reflective part 611 and a second reflective part 612. The first reflective part 611 is arranged on the light source component 5 and located on a side of the light source component 5 away from the bottom plate 11, the first reflective part 611 may be connected and fixed to the light source component 5 through the third adhesive layer 83, the third adhesive layer 83 may be a double-sided adhesive layer, and the first reflective part 611 may reflect light emitted backward from the light source component 5 to the display panel 7. The second reflective part 612 is arranged on the first sub-support 121, thereby facilitating the installation and fixation of the second reflective part 612. The first optical film 62 is arranged on the second support sub-part 122, and the first optical film 62 is located on a side of the second support sub-part 122 close to the display panel 7. Through setting the support part 120 to include the first support sub-part 121 and the second support sub-part 122, the installation and fixation of the second reflective part 612 and the first optical film 62 are facilitated.

The first optical film 62 may sufficiently diffuse the light emitted from the light source 5, so that the light uniformly irradiates onto the display panel 7 to achieve a uniform display. For example, the first optical film 62 may be a diffuser.

In some embodiments of the present disclosure, referring to FIGS. 10, and 31-35, the backlight assembly may include a second optical film 63, and the second optical film 63 may perform a brightness enhancement function. For example, the second optical film may be a brightness enhancement film. The second optical film 63 may be a single layer. Alternatively, the second optical film 63 may be multiple layers stacked together. A positioning pillar 124 is formed on a side of the side plate 12 close to the display panel 7, for example, the positioning pillar 124 is formed on a side of the second support sub-part 122 close to the display panel 7. A positioning hole 631 matching the positioning pillar 124 is formed in the second optical film 63. Where the second optical film 63 is installed on the back plate 1, the second optical film 63 may be conveniently installed and fixed on the back plate 1 by the matching of the positioning hole 631 in the second optical film 63 and the positioning pillar 124 on the side plate 12.

Figure 10:
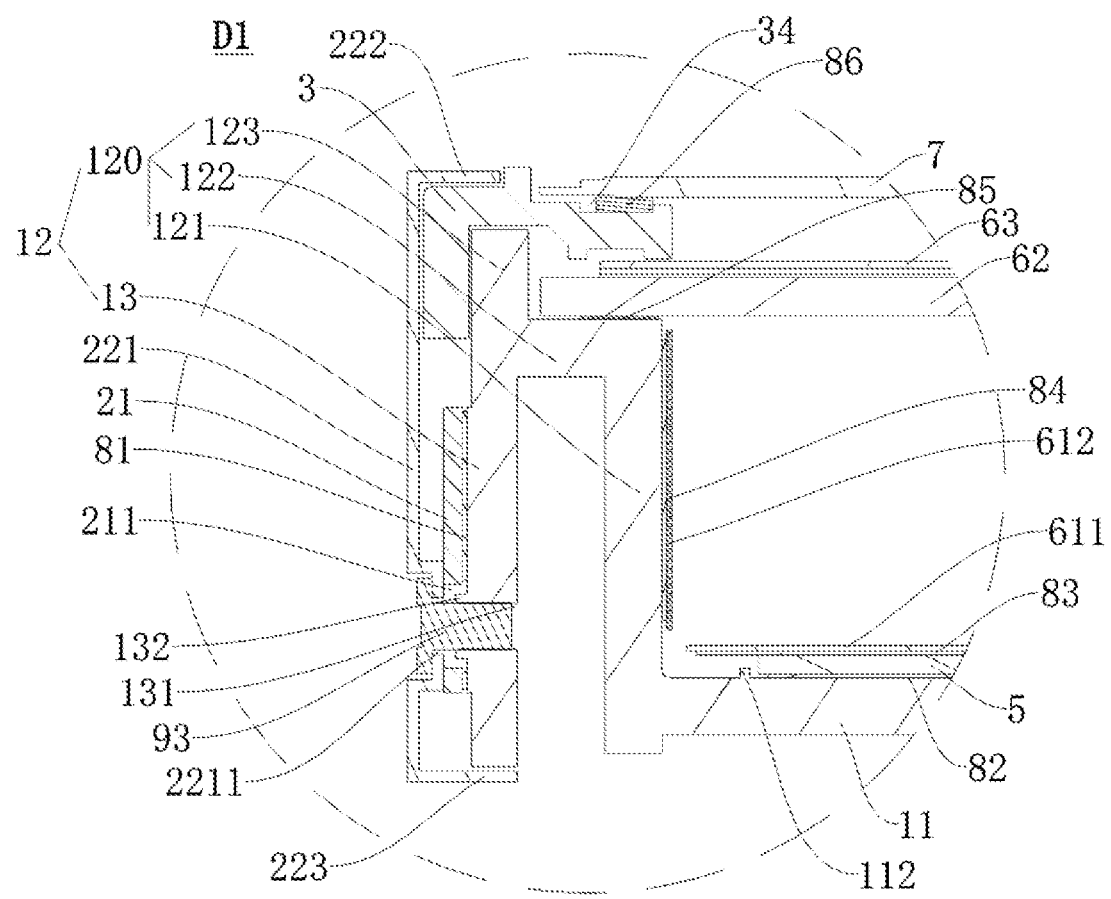
FIG. 10 is an enlarged view of a part D1 in FIG. 9.
Figure 11:
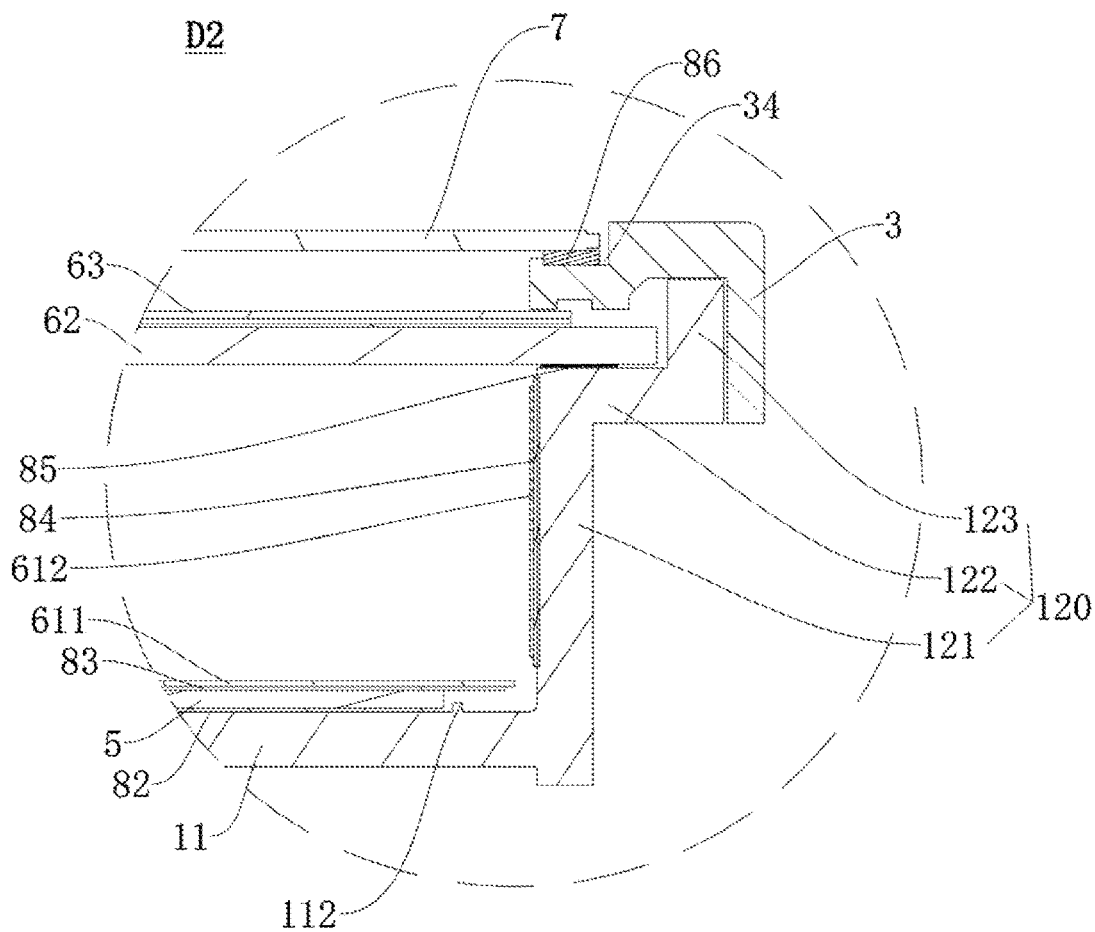
FIG. 11 is an enlarged view of a part D2 in FIG. 9.
Figure 12:
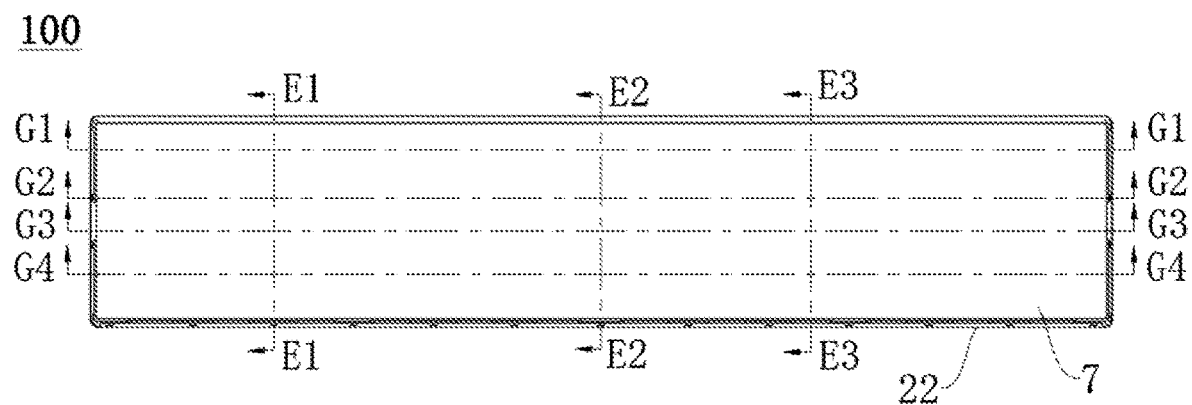
FIG. 12 is a front view of the curved display module in FIG. 1.
Figure 13:
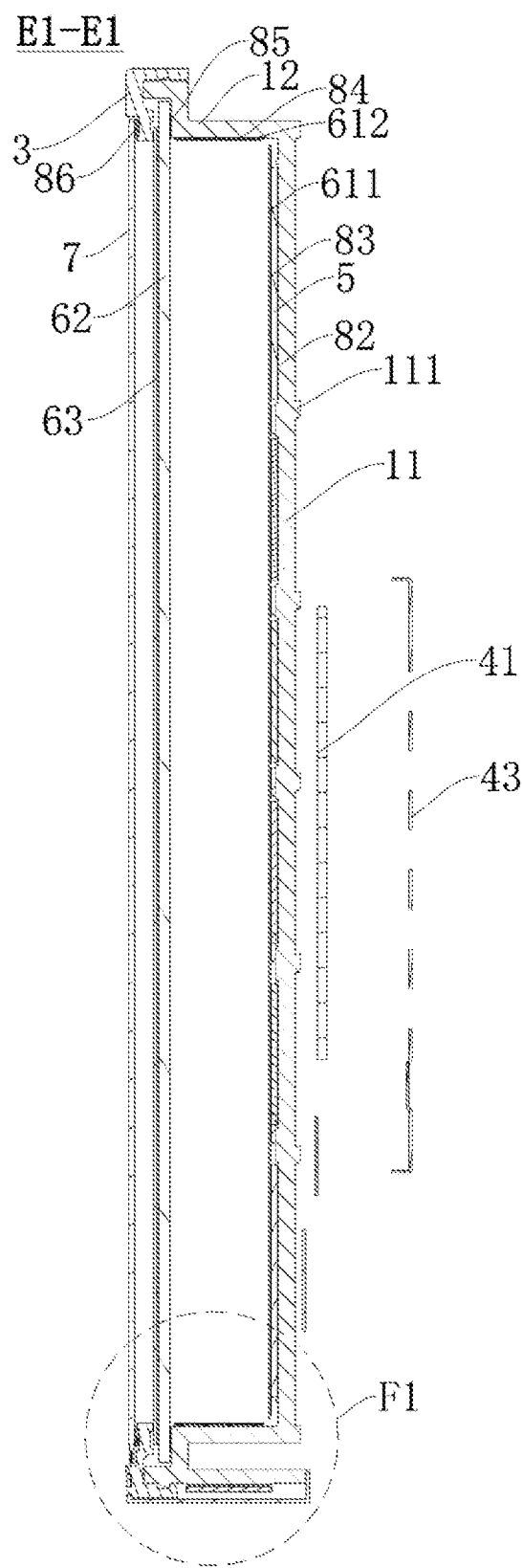
FIG. 13 is a cross-sectional view taken along a line E1-E1 in FIG. 12.
Figure 14:
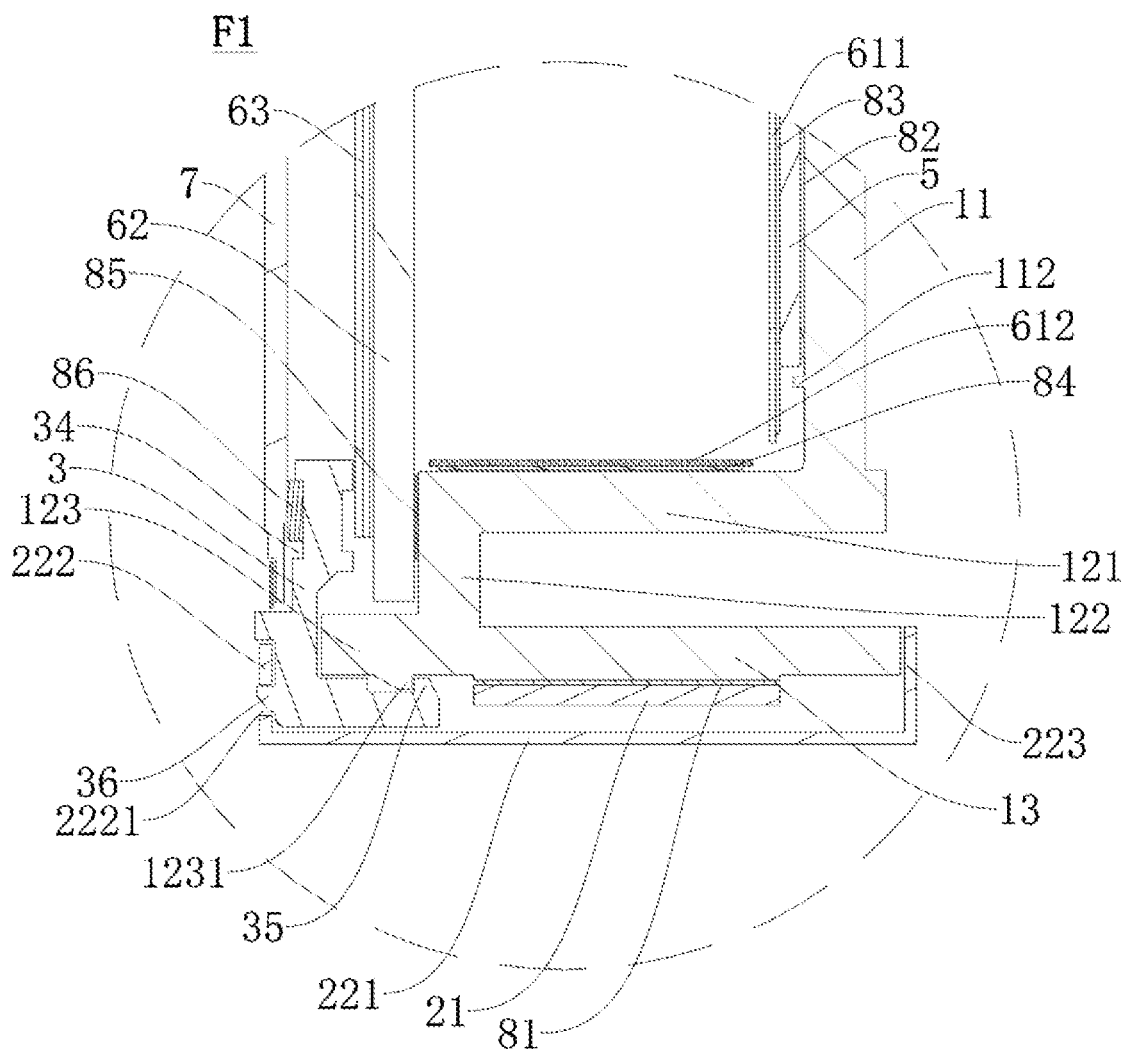
FIG. 14 is an enlarged view of a part F1 in FIG. 13.
Figure 15:
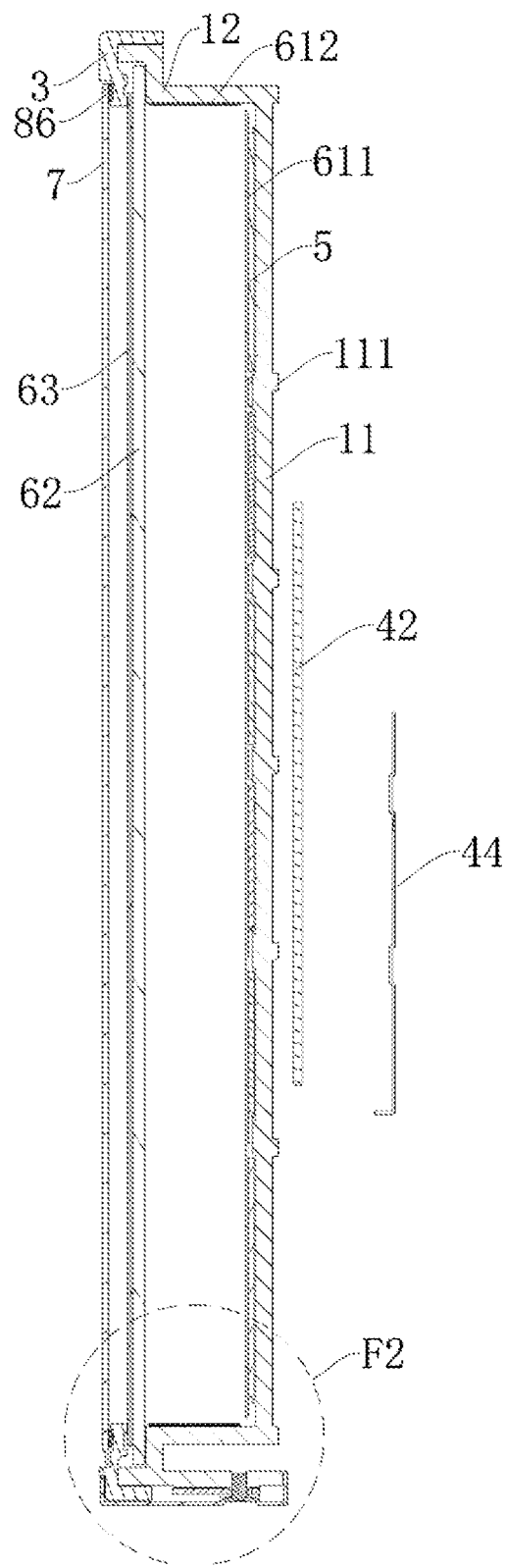
FIG. 15 is a cross-sectional view taken along a line E2-E2 in FIG. 12.
Figure 16:
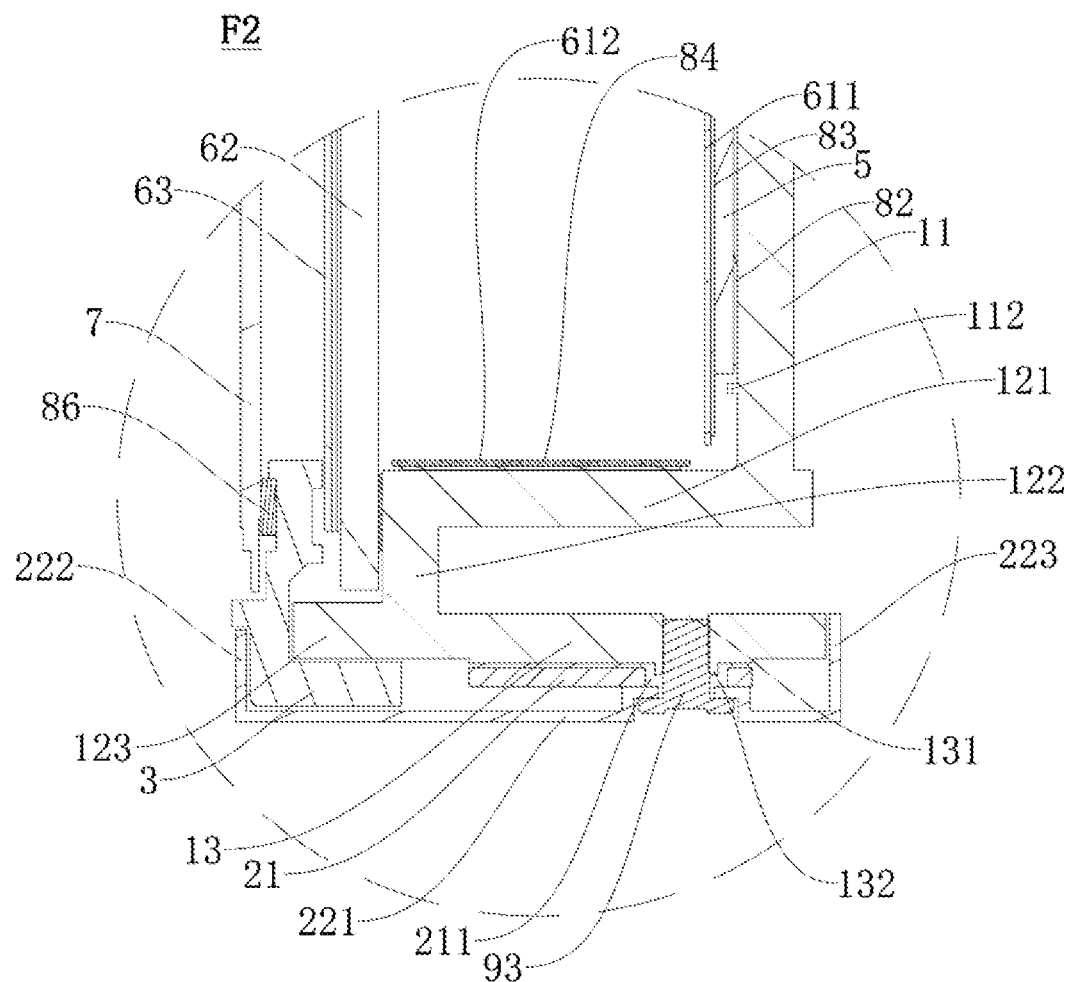
FIG. 16 is an enlarged view of a part F2 in FIG. 15.
Figure 17:
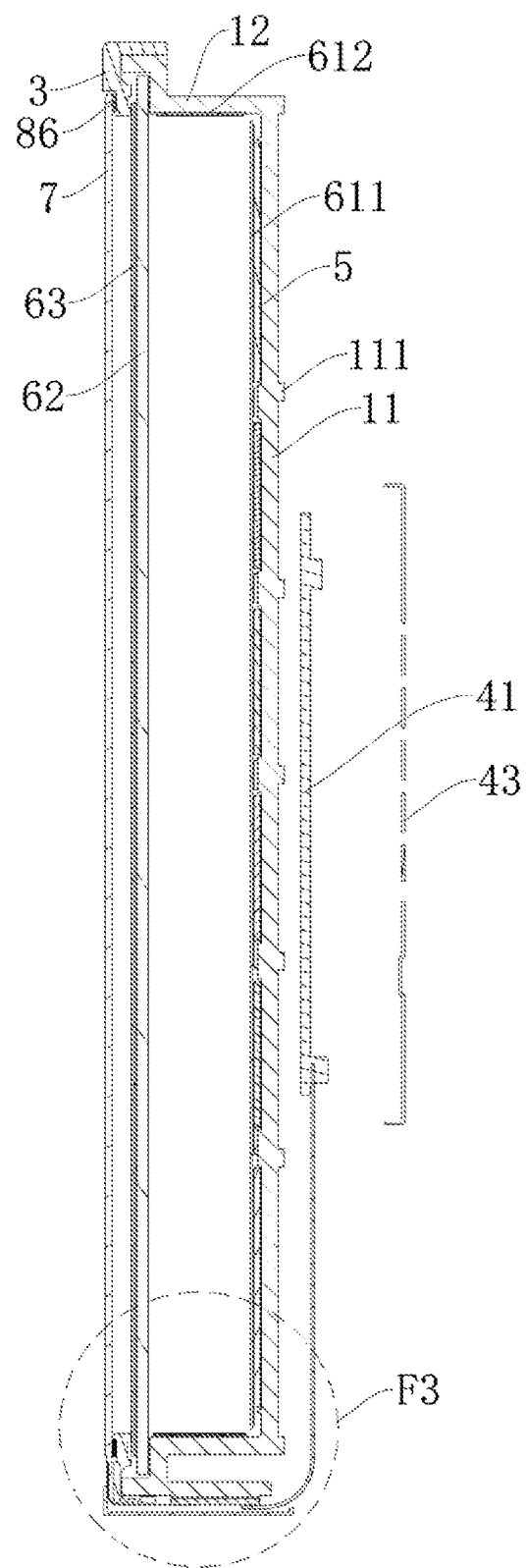
FIG. 17 is a cross-sectional view taken along a line E3-E3 in FIG. 12.

In some alternative embodiments of the present disclosure, referring to FIG. 10, the curved display module 100 includes a middle frame 3, which is arranged on a side of the side plate 12 close to the display panel 7 and connected to the side plate 12. The middle frame 3 may be a plastic piece or a metal piece, for example, the middle frame 3 may be made of PC (polycarbonate) plus GF (glass fiber) at 10% ratio, so that the middle frame 3 has a high structural strength to meet the requirements. The middle frame 3 may be black. The middle frame 3 abuts against an outer periphery of the optical film close to the middle frame 3. Where the first optical film 62 and the second optical film 63 are included as described above, the middle frame 3 may abuts against the outer periphery of the second optical film 63 close to the middle frame 3. The display panel 7 is located on a side of the middle frame 3 away from the optical film, and the display panel 7 is supported on the middle frame 3.

Through arranging the middle frame 3 on a side of the side plate 12 close to the display panel 7, the installation and fixation of the display panel 7 can be conveniently realized. Further, the middle frame 3 is arranged to abut against the outer periphery of the optical film close to the middle frame 3, so that the structure of the curved display module 100 as a whole is compact and stable. Through arranging the middle frame 3 on a side of the side plate 12 close to the display panel 7, and meanwhile causing the side plate 12 of the back plate 1 to realize the function of the lower housing in the related art, the lower housing in the related art is omitted, and the design of a single-layer middle frame is realized, which is favorable to reducing the factors interfering the curvature of the module. Further, through installing and fixing the display panel 7 on the middle frame 3, a zero-bazel design can be realized, a bazel in the related art is omitted, thereby an interference of the bazel to the curvature of the module is eliminated, and the curvature precision and the stability of the curved display module 100 can be further promoted.

Figure 9:
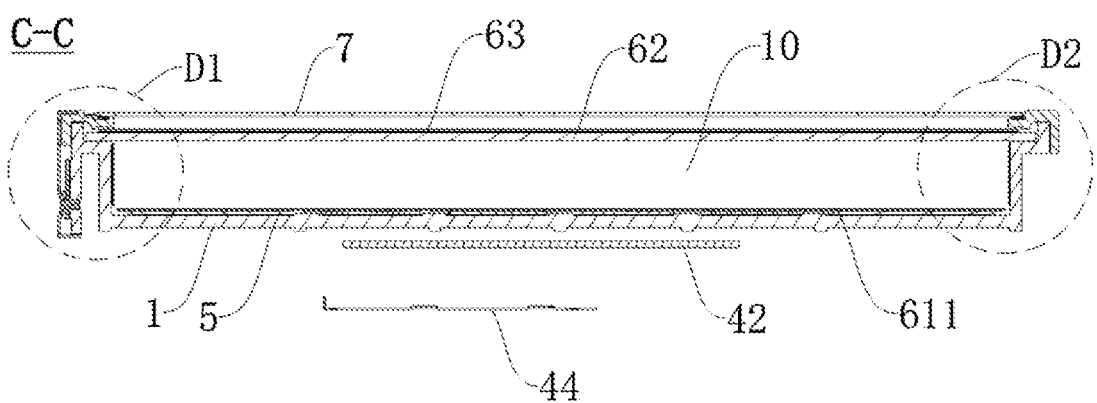
FIG. 9 is a cross-sectional view taken along a line C-C in FIG. 8.

According to some embodiments of the present disclosure, referring to FIGS. 9 and 10, the side plate 12 has a first fixing hole 131. For example, where the display panel circuit board 21 is arranged at the ground side of the side plate 12, the ground side of the side plate 12 has the first fixing hole 131. The display panel circuit board 21 is formed with a second fixing hole 211 corresponding to the first fixing hole 131, and a fastener (e.g., a third fastener 93 described below) passes through the first fixing hole 131 and the second fixing hole 211 to connect the display panel circuit board 21 to the back plate 1. The fastener may be a screw. A first adhesive layer 81 may be arranged between the display panel circuit board 21 and the side plate 12. The first adhesive layer 81 may be a double-sided adhesive layer to adhere the display panel circuit board 21 on the side plate 12. Through arranging the fastener to pass through the first fixing hole 131 and second fixing hole 211, the display panel circuit board 21 can be installed and fixed on the side plate 12 more firmly.

Where the side plate 12 includes the support part 120 and the circuit board fixing part 13, the circuit board fixing part 13 is formed with the first fixing hole 131 described above.

In some alternative embodiments of the present disclosure, referring to FIGS. 9 and 10, a positioning boss 132 for positioning the display panel circuit board 21 is formed on the side plate 12. For example, where the display panel circuit board 21 is arranged at the ground side of the side plate 12, the ground side of the side plate 12 is formed with the first fixing hole 131, and the ground side of the side plate 12 is formed with the positioning boss 132 for positioning the display panel circuit board 21. The positioning boss 132 is arranged around the outer periphery of the first fixing hole 131, and the positioning boss 132 may be annular. A height of the positioning boss 132 may be in a range of 0.25 mm to 0.35 mm, for example, the height of the positioning boss 132 may be 0.3 mm. The display panel circuit board 21 is formed with the second fixing hole 211 corresponding to the first fixing hole 131, the positioning boss 132 matches the second fixing hole 211, and a fastener (for example, a third fastener 93 described below) passes through the first fixing hole 131 and the second fixing hole 211 to connect the display panel circuit board 21 to the back plate 1. The fastener may be a screw. Through arranging the above-mentioned positioning boss 132 on the side plate 12, when installing the display panel circuit board 21 on the back plate 1, the positioning boss 132 on the side plate 12 may match and be accommodated in the first fixing hole 131 in the display panel circuit board 21, thereby the display panel circuit board 21 may be preliminarily positioned on the back plate 1. Then, through arranging the fastener to pass through the first fixing hole 131 and the second fixing hole 211, the display panel circuit board 21 can be installed and fixed on the back plate 1.

Where the side plate 12 includes the support part 120 and the circuit board fixing part 13, the positioning boss 132 is formed on the circuit board fixing part 13.

In some alternative embodiments of the present disclosure, referring to FIGS. 9 and 10, the curved display module 100 includes a first protective cap 22. At least a part of the first protective cap 22 is arranged at the outer side of the side plate 12 and covers the display panel circuit board 21. Through arranging the first protective cap 22 at the outer side of the side plate 12, a protective effect on the display panel circuit board 21 can be achieved. Meanwhile, since the first protective cap 22 is arranged at the outer side of the side plate 12, the influence of the first protective cap 22 on the curvature of the curved display module 100 can be reduced, and the curvature precision and the stability of the curved display module 100 can be further improved. Where the display panel circuit board 21 is arranged at the ground side of the side plate 12, the first protective cap 22 is also located at the ground side of the side plate 12, so that the first protective cap 22 and the display panel circuit board 21 are located at the same side of the side plate 12, and the first protective cap 22 covers the display panel circuit board 21.

Where the side plate 12 includes the support part 120 and the circuit board fixing part 13, at least a part of the first protective cap 22 is arranged at the outer side of the circuit board fixing part 13.

Further, referring to FIG. 10, a third fixing hole 2211 is formed in the first protective cap 22, and the fastener passes through the first fixing hole 131, the second fixing hole 211 and the third fixing hole 2211 to connect the display panel circuit board 21 and the first protective cap 22 to the back plate 1. For example, where the display panel circuit board 21 and the first protective cap 22 are assembled on the back plate 1, the display panel circuit board 21 may be initially fixed on the back plate 1 through the first adhesive layer 81, and then the fastener passes through the first fixing hole 131, the second fixing hole 211, and the third fixing hole 2211 to connect the display panel circuit board 21 and the first protective cap 22 to the back plate 1. Therefore, the first protective cap 22 and the display panel circuit board 21 share the fastener, the number of parts is reduced, the assembling procedure is also simplified, and the display panel circuit board 21 and the first protective cap 22 are conveniently installed and fixed on the back plate 1.

According to some embodiments of the present disclosure, referring to FIGS. 7 to 10, the curved display module 100 further includes a first protective cap 22. At least a part of the first protective cap 22 is arranged at the outer side of the side plate 12, the first protective cap 22 and the display panel circuit board 21 are located at the same side of the side plate 12, the first protective cap 22 covers the display panel circuit board 21, and the first protective cap 22 serves for protecting the display panel circuit board 21. Through arranging the first protective cap 22 at the outer side of the side plate 12, a protective effect on the display panel circuit board 21 can be achieved. Meanwhile, since the first protective cap 22 is arranged at the outer side of the side plate 12, the influence of the first protective cap 22 on the curvature of the curved display module 100 may be reduced, and the curvature precision and the stability of the curved display module 100 are further improved. Where the display panel circuit board 21 is arranged at the ground side of the side plate 12, the first protective cap 22 is also located at the ground side of the side plate 12, so that the first protective cap 22 and the display panel circuit board 21 are located at the same side of the side plate 12, and the first protective cap 22 covers the display panel circuit board 21.

In some alternative embodiments of the present disclosure, referring to FIGS. 7-26 and 50-57, the curved display module 100 includes a middle frame 3. At least a part of the middle frame 3 is arranged on a side of the back plate 1 close to the display panel 7, and the display panel 7 is supported on the middle frame 3. Through arranging the middle frame 3 on a side of the back plate 1 close to the display panel 7, the installation and fixation of the display panel 7 can be conveniently realized, a zero-bazel design can be realized, a bazel in the related art is omitted, thereby an interference of the bazel to the curvature of the module is eliminated, and the curvature precision and the stability of the curved display module 100 is further promoted. Alternatively, the first protective cap 22 may be connected to the back plate 1, and the first protective cap 22 may be connected to both the back plate 1 and the middle frame 3.

The first protective cap 22 may include a protective part 221 and a first flanging 222, and the protective part 221 is located at the outer side of the side plate 12 and/or an outer side of the middle frame 3 (the outer side of the middle frame 3 refers to a side of the middle frame 3 away from the accommodating space 10). The protective part 221 as a whole may be located at the outer side of the side plate 12, and the protective part 221 is connected to the side plate 12. The protective part 221 as a whole may alternatively be located at the outer side of the middle frame 3, and the protective part 221 is connected to the middle frame 3. Alternatively, the protector part 221 is located at the outer side of the side plate 12 and the outer side of the middle frame 3 (a part of the protective part 221 is located at the outer side of the side plate 12, and another part of the protective part 221 is located at the outer side of the middle frame 3). For example, where the display panel circuit board 21 is arranged at the ground side of the side plate 12, the protective part 221 is located at the ground side of the side plate 12 and/or the ground side of the middle frame 3. The first flanging 222 is located on a side of the protective part 221 close to the display panel 7 (for example, the first flanging 222 is located on a front side of the protective part 221), and the first flanging 222 abuts against a side surface of the middle frame 3 close to the display panel 7 (for example, the first flanging 222 abuts against a front side surface of the middle frame 3). With the first protective cap 22 having the above-mentioned structure including the protective part 221 and the first flanging 222, the structure of the first protective cap 22 is simple, and the first protective cap 22 conveniently covers the outer side of the display panel circuit board 21 to protect the display panel circuit board 21, and the first flanging 222 abuts against the side surface of the middle frame 3 close to the display panel 7, so that the first protective cap 22 may be conveniently installed and fixed on the back plate 1 and/or the middle frame 3, and the structure of the curved display module 100 as a whole is compact, stable and reliable.

Further, referring to FIGS. 7 to 26 and 50 to 57, the first protective cap 22 may further include a second flanging 223, the second flanging 223 is located on a side of the protective part 221 away from the display panel (for example, the second flanging 223 is located on a back side of the protective part 221), and the second flanging 223 abuts against a side surface of the side plate 12 away from the display panel 7 (for example, the second flanging 223 abuts against a back side surface of the side plate 12). For example, the second flanging 223 abuts against a side surface of the circuit board fixing part 13 away from the display panel 7. Through setting the first protective cap 22 to have the above-mentioned structure including the protective part 221, the first flanging 222 and the second flanging 223, the first protective cap 22 is in a U-shaped structure, the structure of the first protective cap 22 is simple, and the first protective cap 22 conveniently covers the outer side of the display panel circuit board 21 to protect the display panel circuit board 21. Further, the first flanging 222 abuts against the side surface of the middle frame 3 close to the display panel 7, the second flanging 223 abuts against the side surface of the side plate 12 away from the display panel 7, so that the first protective cap 22 may be conveniently installed and fixed on the back plate 1 and/or the middle frame 3, and the structure of the curved display module 100 as a whole is compact, stable and reliable.

According to some embodiments of the present disclosure, referring to FIGS. 9-26, and 43-49, the backlight assembly includes a light source component 5. The light source component 5 is arranged on the bottom plate 11, the light source component 5 may be fixed on the bottom plate 11 through a second adhesive layer 82, the second adhesive layer 82 may be a double-sided adhesive layer, and the light source component 5 may provide a light source for the display panel 7. The reflector 61 includes a first reflective part 611 and a second reflective part 612. The first reflective part 611 is arranged on the light source component 5 and located on a side of the light source component 5 away from the bottom plate 11, the first reflective part 611 may be connected and fixed to the light source component 5 through the third adhesive layer 83, the third adhesive layer 83 may be a double-sided adhesive layer, and the first reflective part 611 may reflect light emitted backward from the light source component 5 to the display panel 7. The second reflective part 612 is arranged on the side plate 12, the second reflective part 612 may be fixed on the side plate 12 through a fourth adhesive layer 84, the fourth adhesive layer 84 may be a double-sided adhesive layer, and the second reflective part 612 can ensure a uniform light mixing at an edge and avoid a shadow region.

Figure 18:
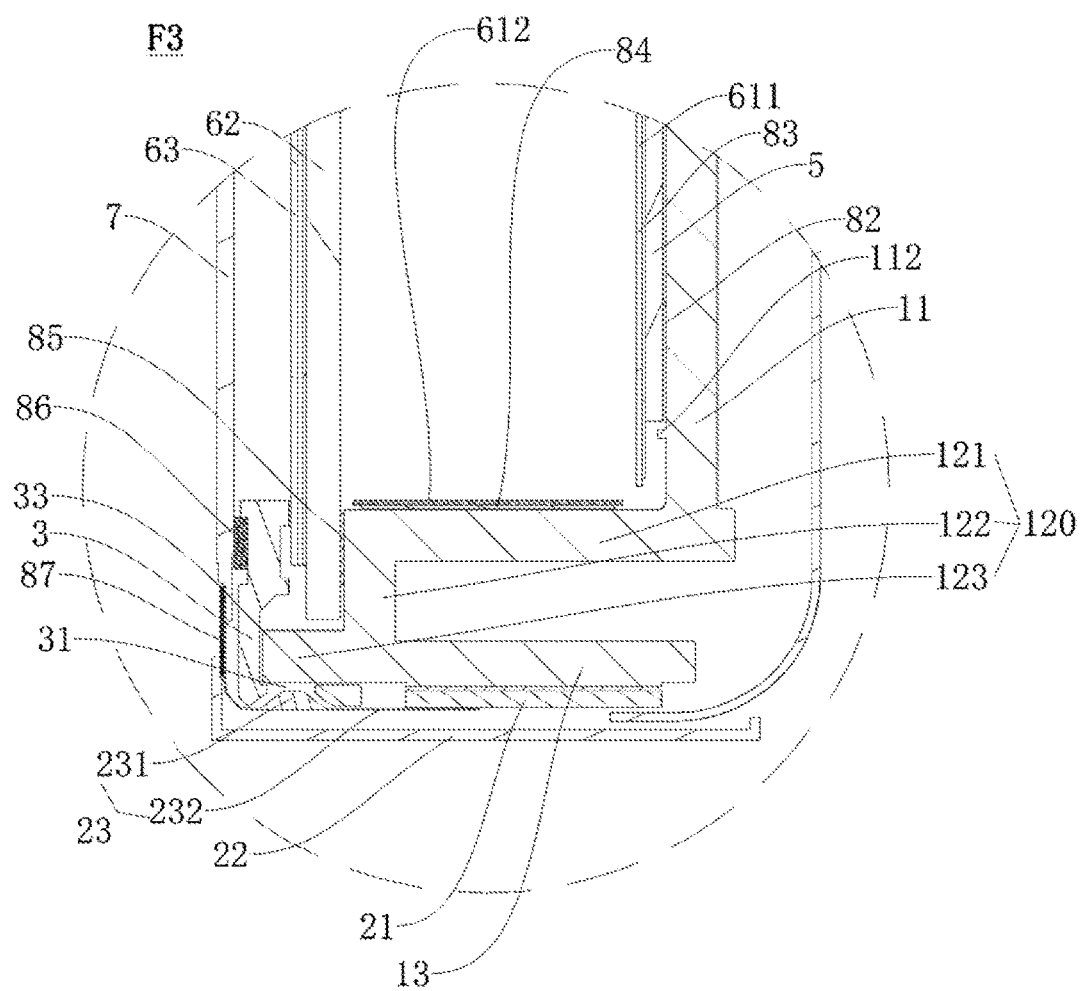
FIG. 18 is an enlarged view of a part F3 in FIG. 17.
Figure 19:
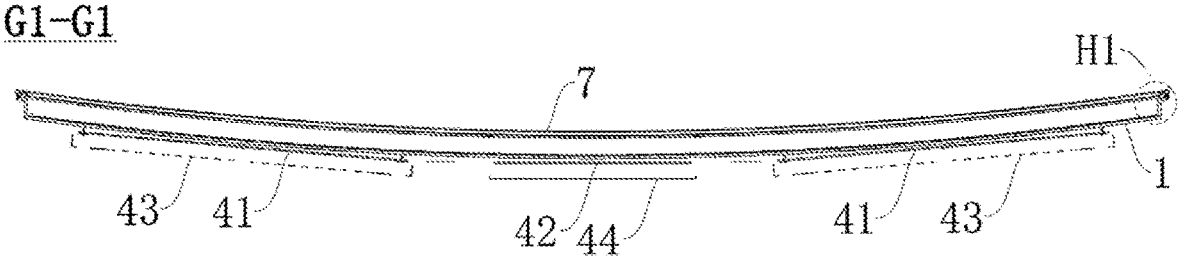
FIG. 19 is a cross-sectional view taken along a line G1-G1 in FIG. 12.
Figure 20:
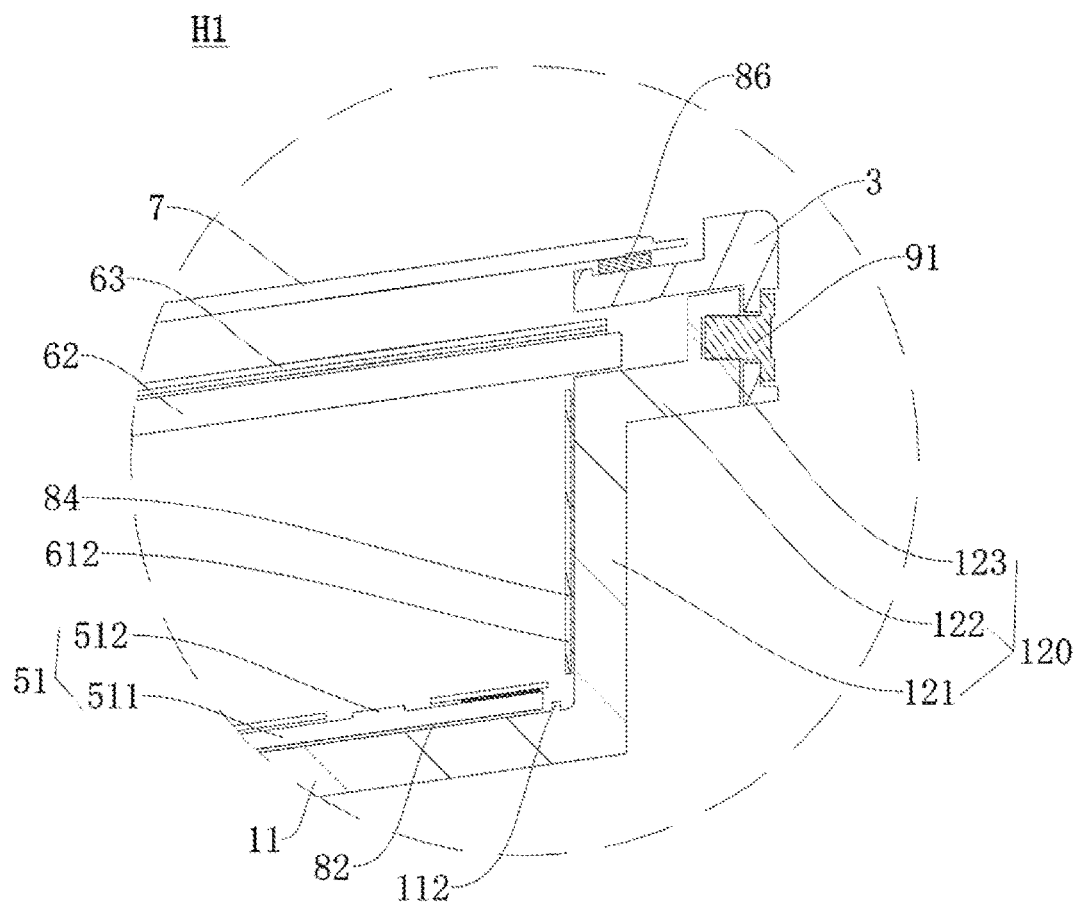
FIG. 20 is an enlarged view of a part H1 in FIG. 19.
Figure 21:
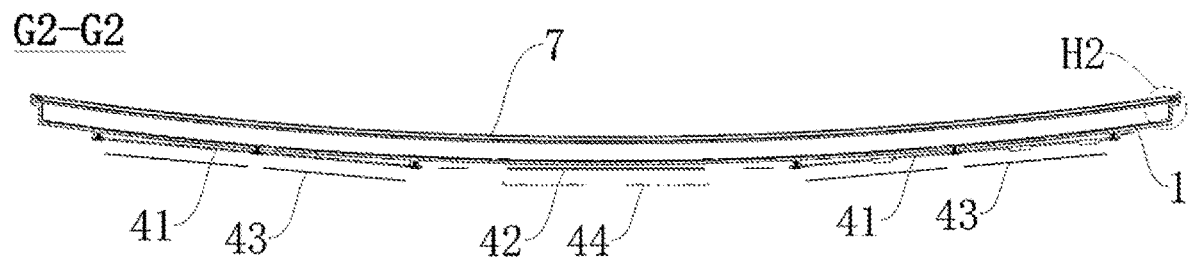
FIG. 21 is a cross-sectional view taken along a line G2-G2 in FIG. 12.
Figure 22:
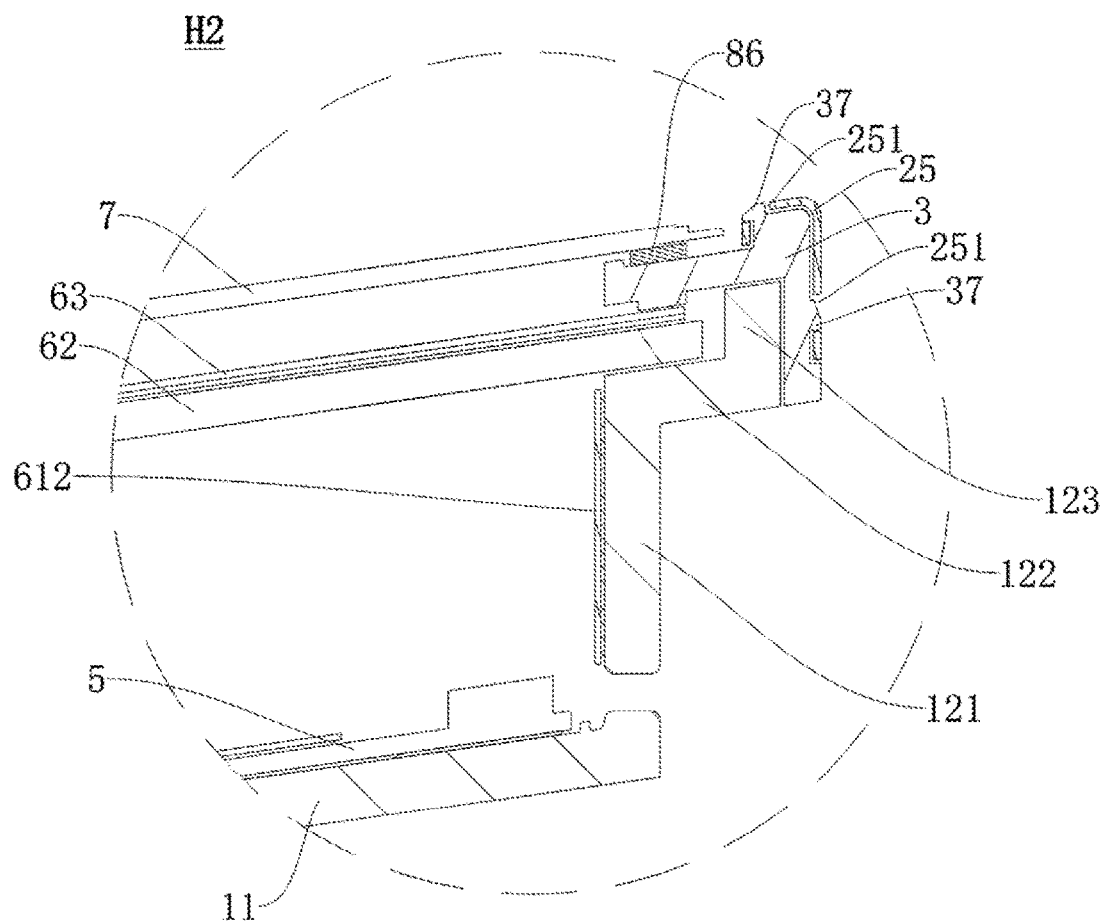
FIG. 22 is an enlarged view of a part H2 in FIG. 21.
Figure 23:
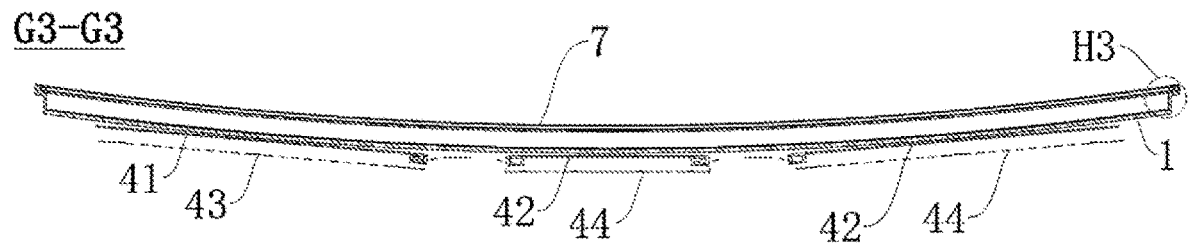
FIG. 23 is a cross-sectional view taken along a line G3-G3 in FIG. 12.
Figure 24:
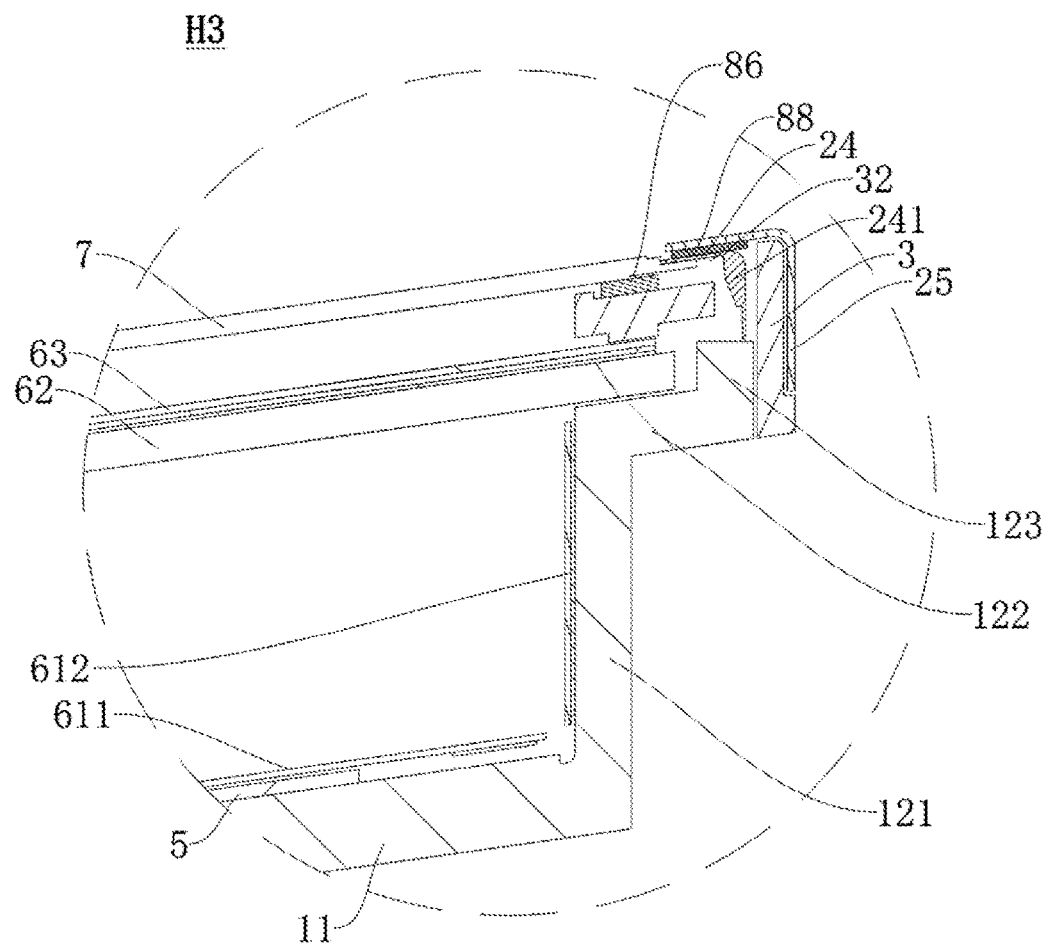
FIG. 24 is an enlarged view of a part H3 in FIG. 23.
Figure 25:
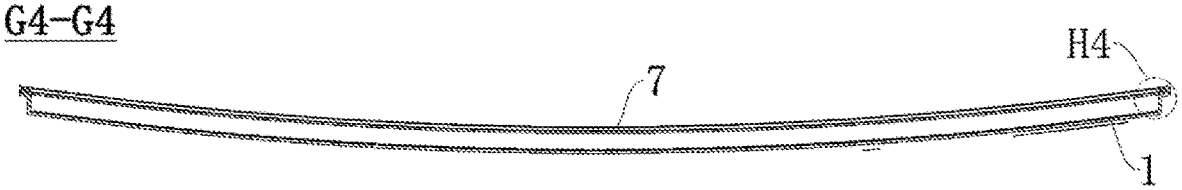
FIG. 25 is a cross-sectional view taken along a line G4-G4 in FIG. 12.
Figure 26:
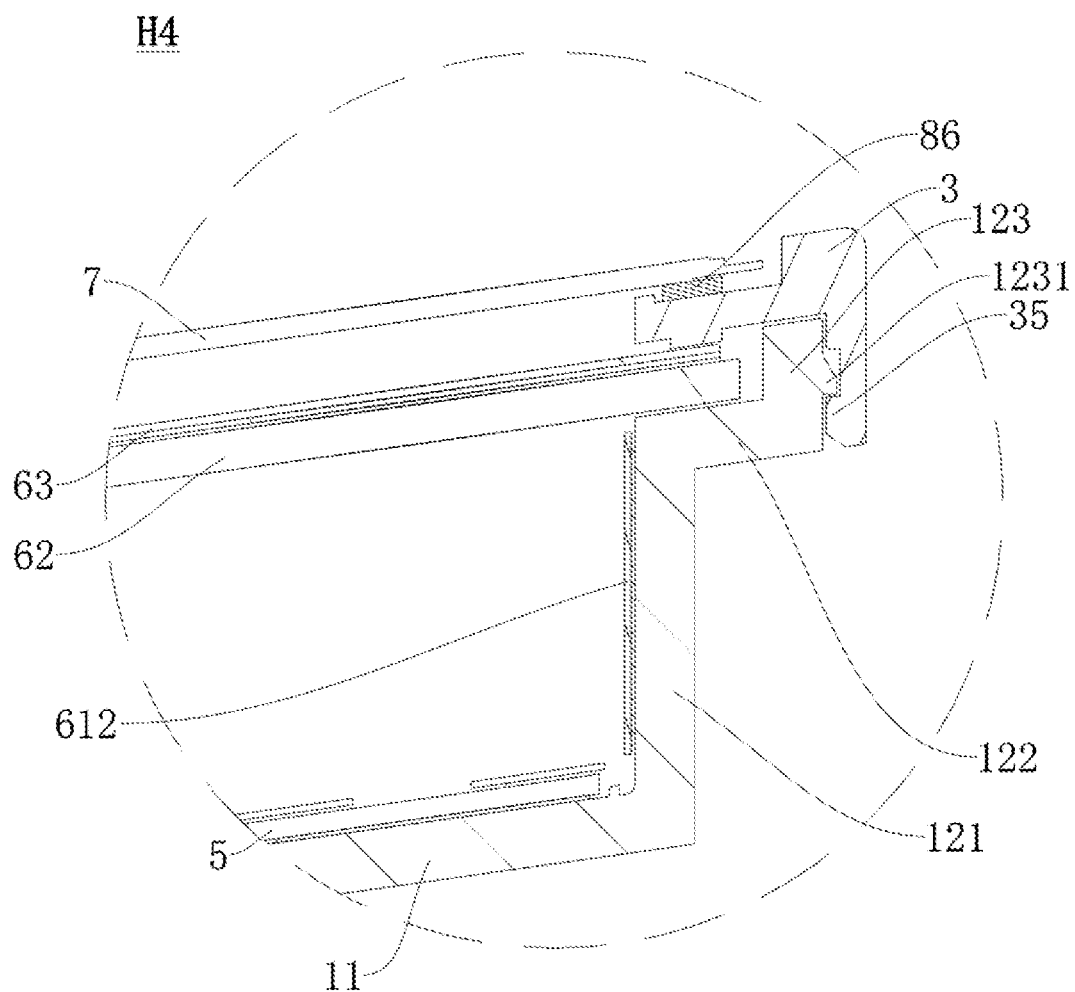
FIG. 26 is an enlarged view of a part H4 in FIG. 25.
Figure 27:
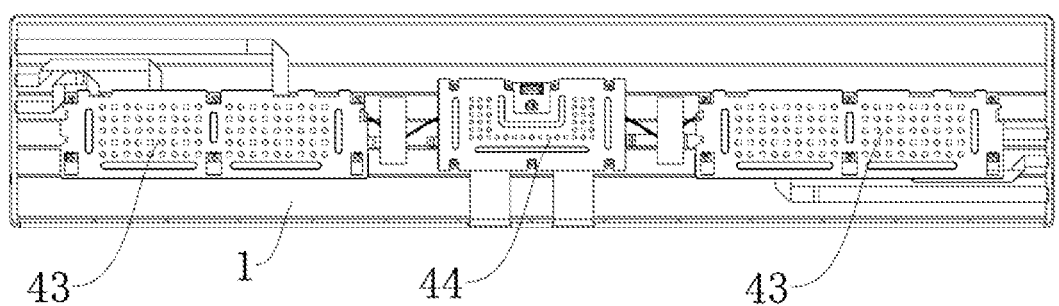
FIG. 27 is a back view of the curved display module in FIG. 1.
Figure 28:
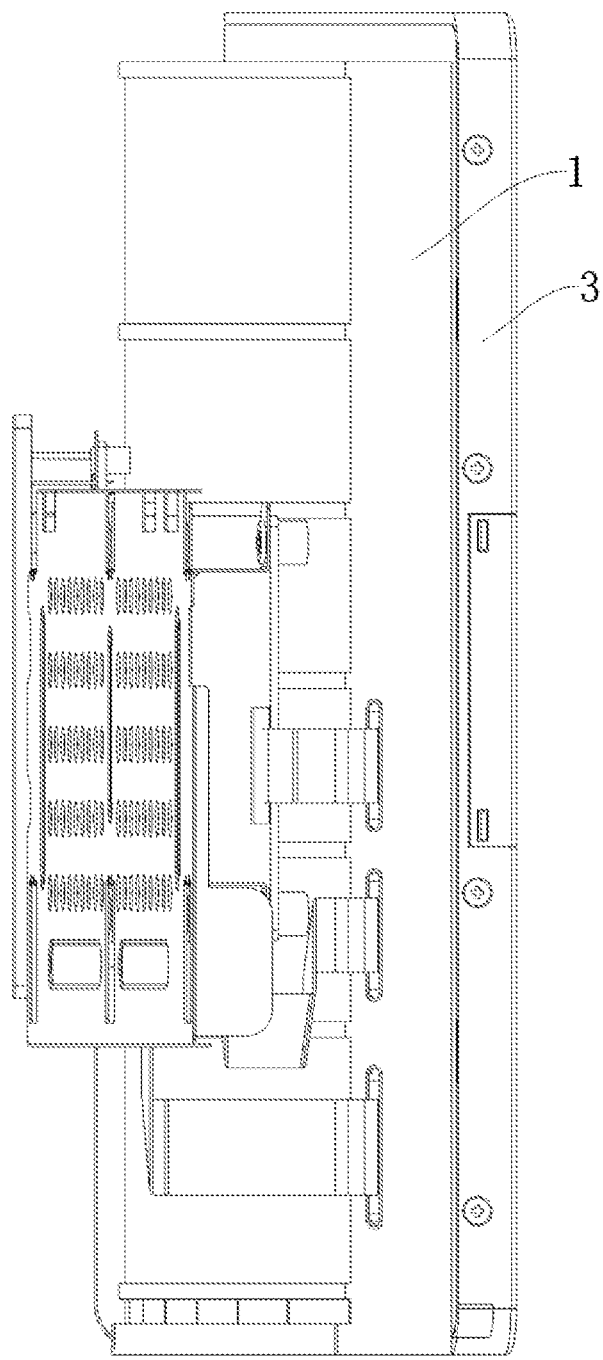
FIG. 28 is a left side view of the curved display module in FIG. 1.
Figure 29:
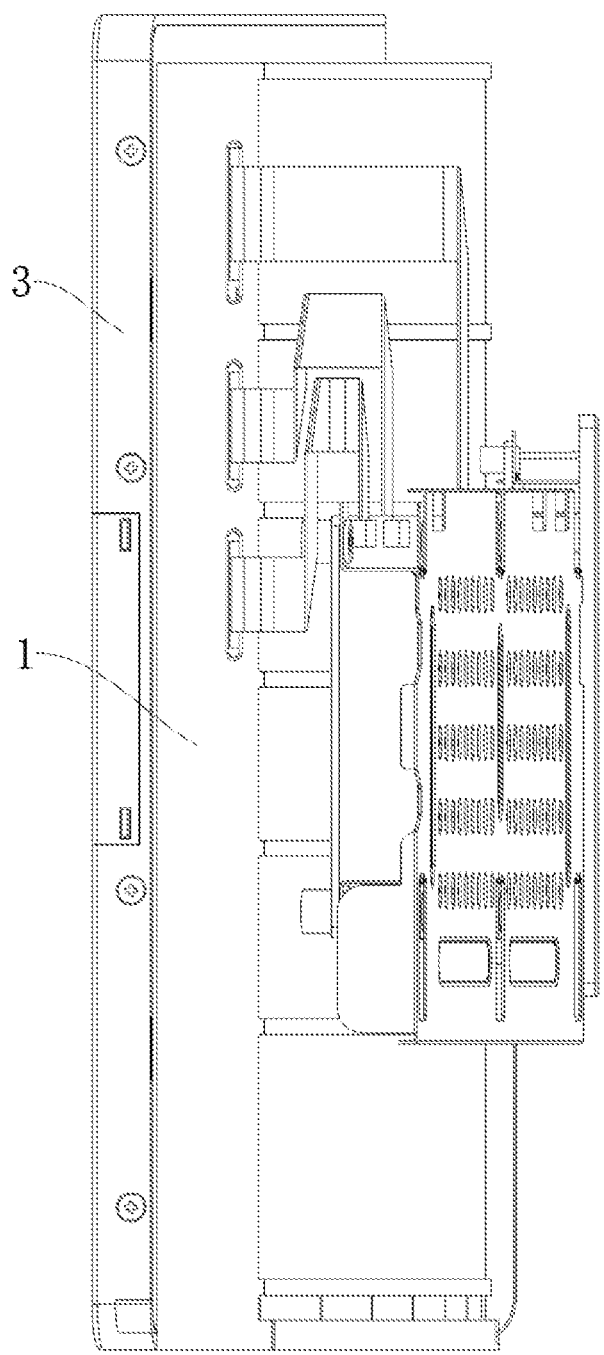
FIG. 29 is a right side view of the curved display module in FIG. 1.
Figure 30:
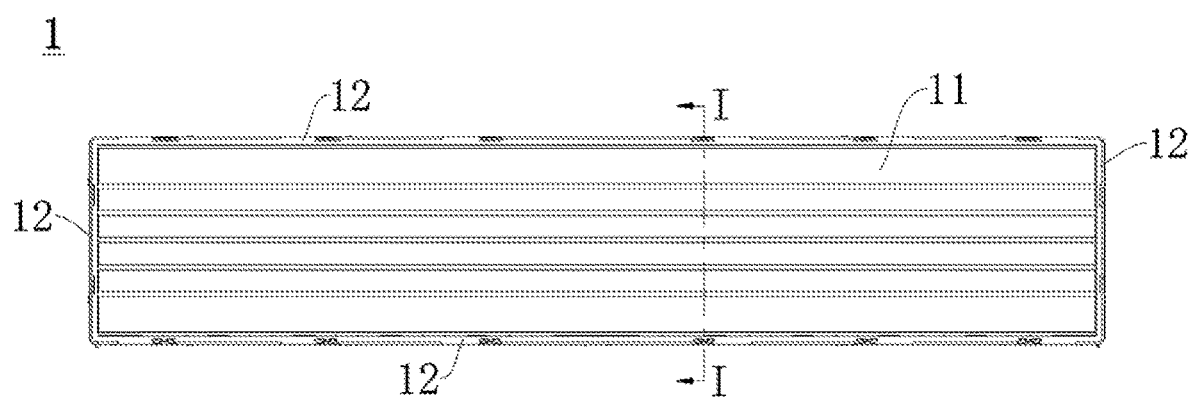
FIG. 30 is a front view of a back plate of the curved display module in FIG. 1.
Figure 31:
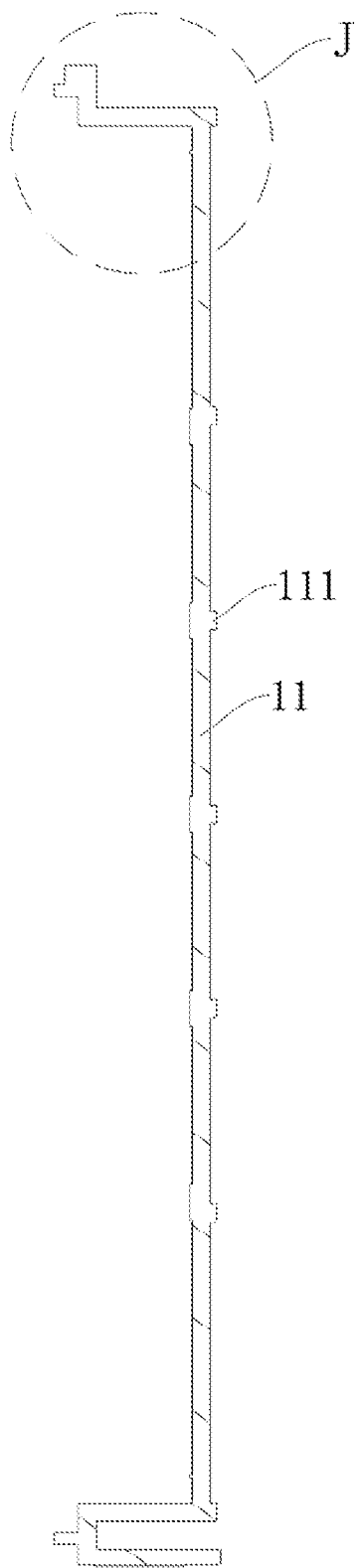
FIG. 31 is a cross-sectional view taken along a line I-I in FIG. 30.
Figure 32:
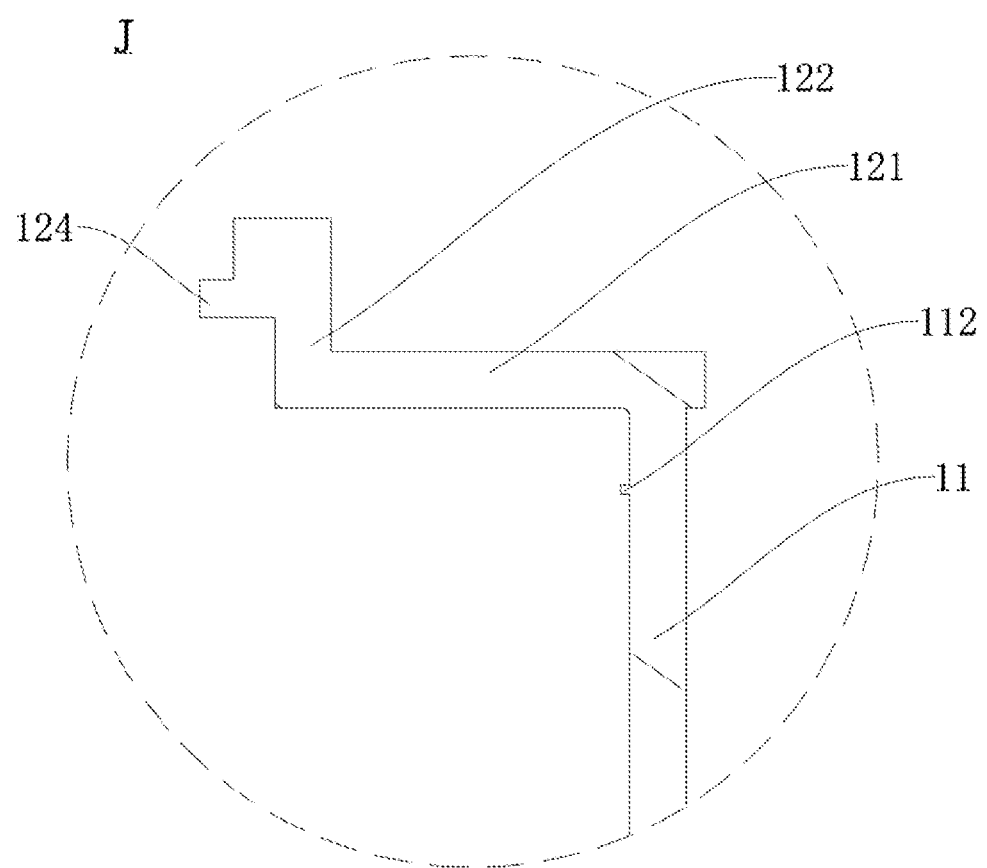
FIG. 32 is an enlarged view of a part J in FIG. 31.
Figure 33:
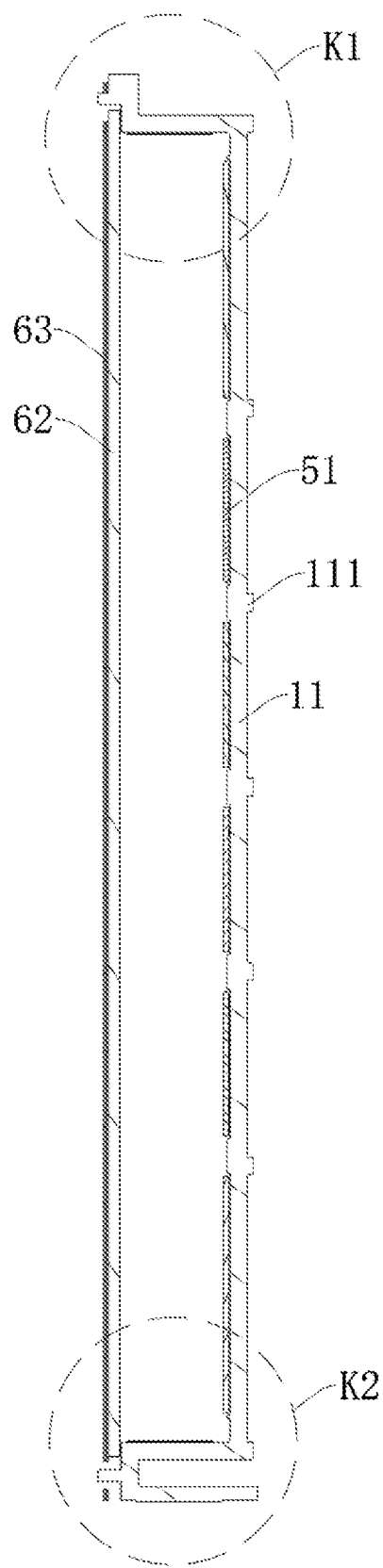
FIG. 33 is a cross-sectional view of the curved display module in FIG. 1 at a position.
Figure 34:
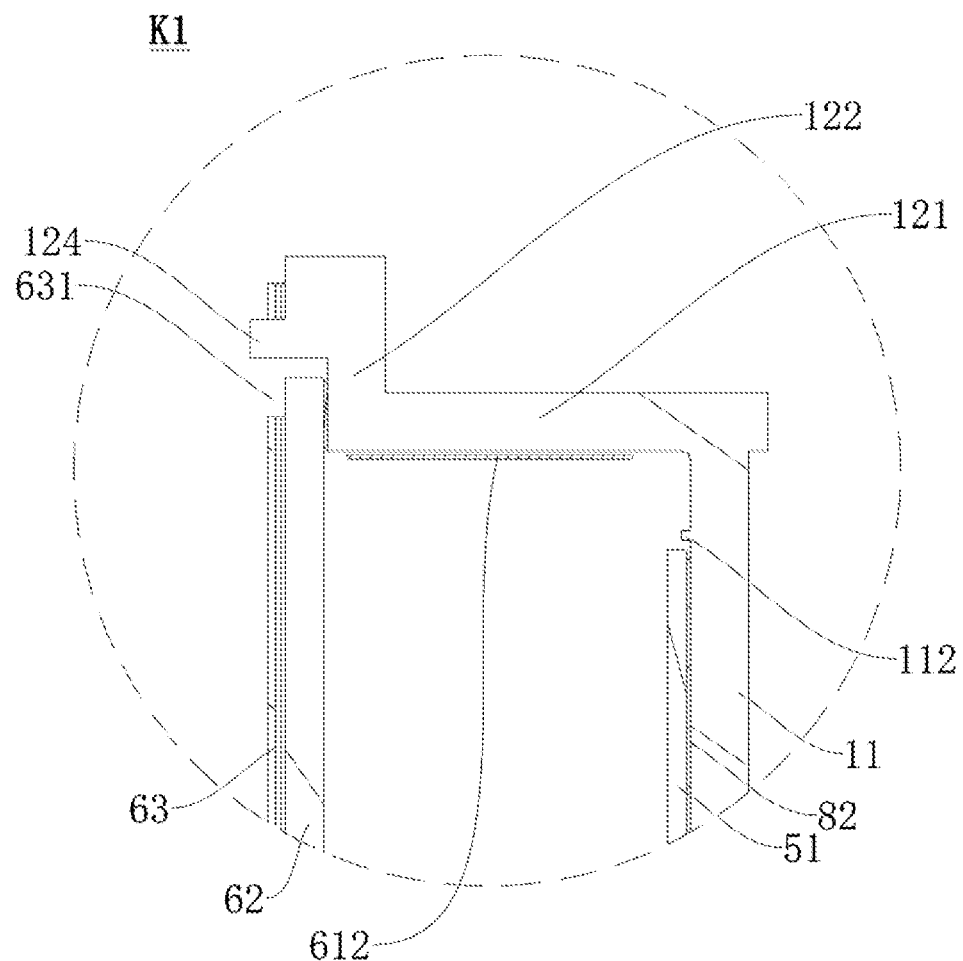
FIG. 34 is an enlarged view of a part K1 in FIG. 33.
Figure 35:
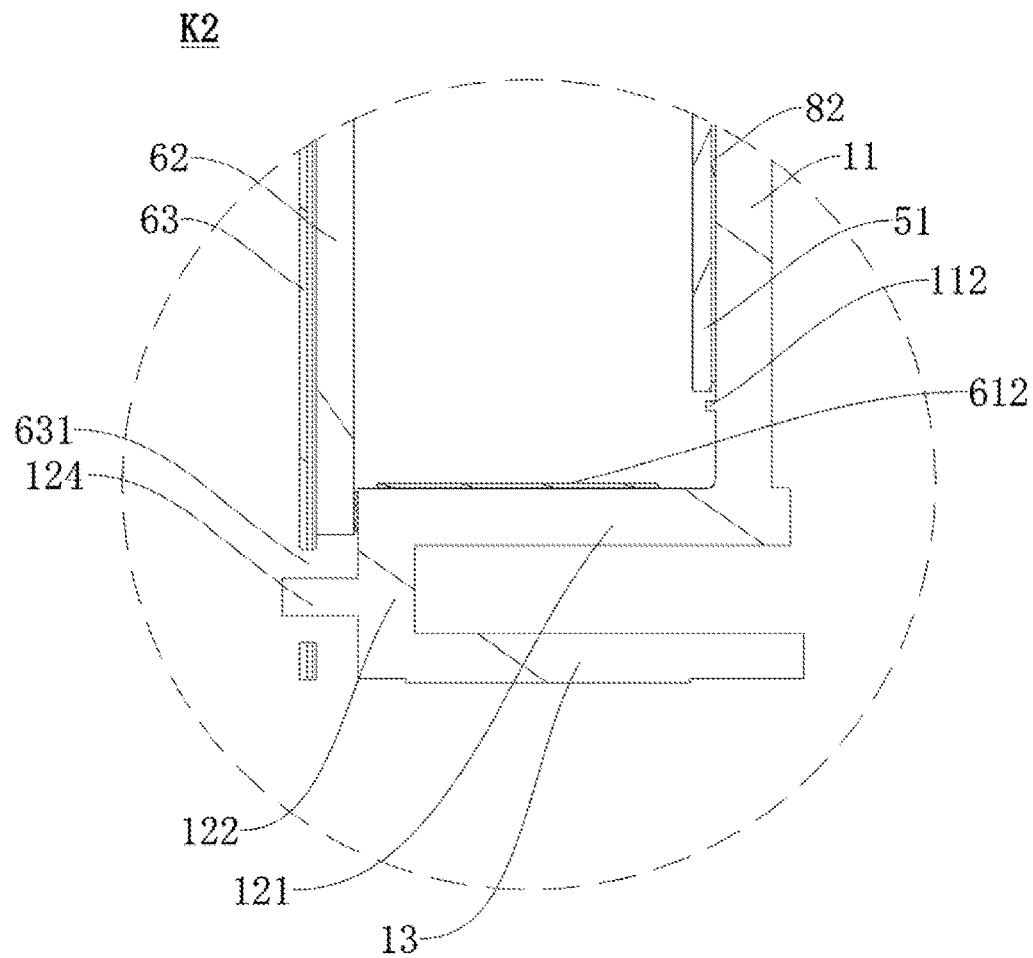
FIG. 35 is an enlarged view of a part K2 in FIG. 33.

According to some embodiments of the present disclosure, referring to FIGS. 10, 18 and 24, the curved display module 100 includes a chip on film assembly. The chip on film assembly is arranged at the outer side of the side plate 12, thereby an influence of the chip on film assembly on the curvature of the module can be reduced. The chip on film assembly serves for transmitting a driving signal to the display panel 7, and may include a source-chip on film (abbreviated as S-COF) 23 and a gate-chip on film (abbreviated as G-COF) 24. The source-chip on film 23 may transmit a source driving signal to a source line in a substrate of the display panel 7, and the gate-chip on film 24 may transmit a gate driving signal to a gate line in the substrate of the display panel 7.

In some embodiments of the present disclosure, referring to FIGS. 10, 18 and 24, the chip on film assembly includes a source-chip on film 23. The source-chip on film 23 and the display panel circuit board 21 are located at the same side of the side plate 12. For example, the display panel circuit board 21 is arranged at the ground side of the side plate 12, and the source-chip on film 23 of the curved display module 100 is also arranged at the ground side of the side plate 12. On the basis of arranging the display panel circuit board 21 at the outer side of the side plate 12, the space at the outer side of the side plate 12 is further fully utilized, the source-chip on film 23 and the display panel circuit board 21 are located at the same side of the side plate 12, for example, the source-chip on film 23 and the display panel circuit board 21 are located at the ground side of the side plate 12, the installation is easy at this position, the space at this position is comparatively sufficient, the assembly requirements can be satisfied, the influence on the curvature of the module can be significantly reduced, and the curvature precision of the curved-surface display module 100 can be further improved.

Further, the curved display module 100 further includes a second protective cap 26, and the second protective cap 26 is arranged at the outer side of the side plate 12 and covers the source-chip on film 23. The second protective cap 26 and the source-chip on film 23 are located on the same side of the side plate 12, for example, where the source-chip on film 23 is arranged at the ground side of the side plate 12, the second protective cap 26 is arranged at the ground side of the side plate 12, and the second protective cap 26 may protect the source-chip on film 23. On the basis of arranging the display panel circuit board 21 at the outer side of the side plate 12, the space at the outer side of the side plate 12 is further fully utilized, the source-chip on film 23 and the second protective cap 26 for protecting the source-chip on film 23 are installed and fixed at the outer side of the side plate 12, the installation is easy at this position, the space at this position is comparatively sufficient, and the assembly requirements can be satisfied, the influence on the curvature of the module can be significantly reduced, and the curvature precision of the curved-surface display module 100 can be further improved.

In some embodiments of the present disclosure, referring to FIGS. 10 and 18, the curved display module 100 includes the first protective cap 22 and the second protective cap 26 described above. At least a part of the first protective cap 22 is arranged at the outer side of the side plate 12, the first protective cap 22 covers the display panel circuit board 21, and the first protective cap 22 serves for protecting the display panel circuit board 21. Through arranging the first protective cap 22 at the outer side of the side plate 12, a protective effect on the display panel circuit board 21 can be achieved. Meanwhile, since the first protective cap 22 is arranged at the outer side of the side plate 12, the influence of the first protective cap 22 on the curvature of the curved display module 100 can be reduced, and the curvature precision and the stability of the curved display module 100 are further improved. Alternatively, the second protective cap 26 and the first protective cap 22 are a same protective cap, which may reduce the number of parts, simplify the assembly procedure, and reduce the manufacturing cost.

In some alternative embodiments of the present disclosure, referring to FIG. 18, a spacer 87 is arranged between the second protective cap 26 and the source-chip on film 23. For example, where the second protective cap 26 and the first protective cap 22 are the same protective cap, the spacer 87 is arranged between the first flanging 222 of the first protective cap 22 and the source-chip on film 23. Therefore, the source-chip on film 23 can be protected from being worn by the second protective cap 26. Alternatively, the spacer 87 may be an adhesive tape, which facilitates the installing and fixing of the spacer 87 between the second protective cap 26 and the source-chip on film 23.

In some embodiments of the present disclosure, the chip on film assembly includes a gate-chip on film 24, and the gate-chip on film 24 and the display panel circuit board 21 are located at different sides of the side plate 12, respectively. For example, the display panel circuit board 21 is arranged at the ground side of the side plate 12, and the gate-chip on film 24 of the curved display module 100 is arranged on the left side and the right side of the side plate 12. The gate-chip on film 24 and the display panel circuit board 21 are located on different sides of the side plate 12, respectively, for example, on the basis of arranging the display panel circuit board 21 at the ground side of the side plate 12, the space at the left side and the right side of the side board 12 is further fully utilized, the gate-chip on film 24 is installed and fixed on the left side and the right side of the side board 12, the installation is easy at this position, the space at this position is comparatively sufficient, and the assembly requirements can be satisfied, the influence on the curvature of the module can be significantly reduced, and the curvature precision of the curved-surface display module 100 can be further improved.

Further, the curved display module 100 further includes a third protective cap 25, the third protective cap 25 is arranged at the outer side of the side plate 12 and covers the gate-chip on film 24, and the third protective cap 25 may protect the gate-chip on film 24. On the basis of arranging the display panel circuit board 21 at the outer side of the side plate 12, the space at the outer side of the side plate 12 is further fully utilized, the gate-chip on film 24 and the third protective cap 25 for protecting the gate-chip on film 24 are installed and fixed at the outer side of side plate 12, the installation is easy at this position, the space at this position is comparatively sufficient, and the assembly requirements can be satisfied, the influence on the curvature of the module can be significantly reduced, and the curvature precision of the curved-surface display module 100 can be further improved. Alternatively, a foam layer 88 is arranged between the third protective cap 25 and the gate-chip on film 24 to protect the gate-chip on film 24.

In some alternative embodiments of the present disclosure, referring to FIGS. 10, 18, and 50-57, the curved display module 100 includes a middle frame 3. The middle frame 3 is arranged on a side of the back plate 1 close to the display panel 7, and the display panel 7 is supported on the middle frame 3. Through arranging the middle frame 3 on a side of the back plate 1 close to the display panel 7, the installation and fixation of the display panel 7 can be conveniently realized, a zero-bazel design can be realized, a bazel in the related art is omitted, thereby an interference of the bazel to the curvature of the module is eliminated, and the curvature precision and the stability of the curved display module 100 is further promoted. The chip on film assembly is arranged at the outer side of the middle frame 3, and the middle frame 3 is provided with an avoiding hole for avoiding the chip on film assembly, so that a performance degradation of the display panel 7 caused by pressing the chip on film assembly can be avoided.

For example, where the chip on film assembly includes the source-chip on film 23, the source-chip on film 23 is arranged at the outer side of the middle frame 3. For example, the source-chip on film 23 may be arranged at the ground side of the middle frame 3, and the source-chip on film 23 may be connected and fixed on the middle frame 3, which facilitates the installation and fixation of the source-chip on film 23. The first avoiding hole 31 for avoiding a source chip 231 of the source-chip on film 23 is formed at the outer side of the middle frame 3 (for example, the ground side of the middle frame 3), so that the performance degradation of the display panel 7 caused by pressing the source chip 231 of the source-chip on film 23 can be avoided. A avoiding groove 33 for avoiding a source film 232 of the source-chip on film 23 may be formed at the outer side of the middle frame 3 (for example, the ground side of the middle frame 3), so that the performance degradation of the display panel 7 caused by pressing the source film 232 of the source-chip on film 23 can be avoided.

For example, where the chip on film assembly includes the gate-chip on film 24, the gate-chip on film 24 is arranged at the outer side of the middle frame 3, for example, the gate-chip on films 24 may be arranged on the left side and the right side of the middle frame 3. The gate-chip on film 24 may be connected to the middle frame 3. The middle frame 3 may be provided with a second avoiding hole 32 for avoiding a gate chip 241 of the gate-chip on film 24. The gate-chip on film 24 may be provided at both the left side and the right side of the middle frame 3, each of which is provided with the second avoiding hole 32, which facilitates the installation and fixation of the gate-chip on film 24, and the second avoiding hole 32 provided on the middle frame 3 can eliminate the performance degradation of the display panel 7 caused by pressing the source chip 231 of the gate-chip on film 24.

Alternatively, where the curved display module 100 includes the third protective cap 25 and the middle frame 3, the third protective cap 25 is arranged at the outer side of the middle frame 3 (for example, the third protective cap 25 is arranged on the left side and the right side of the middle frame 3) and covers the gate-chip on film 24, and the third protective cap 25 may protect the gate-chip on film 24. On the basis of arranging the display panel circuit board 21 at the outer side of the side plate 12, the space at the outer side of the side plate 12 is further fully utilized, the gate-chip on film 24 and the third protective cap 25 for protecting the gate-chip on film 24 are installed and fixed at the outer side of side plate 12, the installation is easy at this position, the space at this position is comparatively sufficient, and the assembly requirements can be satisfied, the influence on the curvature of the module can be significantly reduced, and the curvature precision of the curved-surface display module 100 is further improved. Alternatively, a foam layer 88 is arranged between the third protective cap 25 and the gate-chip on film 24 to protect the gate-chip on film 24.

According to some embodiments of the present disclosure, referring to FIG. 10, the curved display module 100 includes a middle frame 3. The middle frame 3 is arranged on a side of the back plate 1 close to the display panel 7, and the display panel 7 is connected to the middle frame 3. Through arranging the middle frame 3 on a side of the back plate 1 close to the display panel 7, the installation and fixation of the display panel 7 can be conveniently realized, a zero-bazel design can be realized, a bazel in the related art is omitted, thereby an interference of the bazel to the curvature of the module is eliminated, and the curvature precision and the stability of the curved display module 100 is further promoted.

According to some alternative embodiments of the present disclosure, referring to FIG. 10, the display panel 7 and the middle frame 3 may be connected together by a foam tape 86 (e.g., a foam tape 86 with a high adhesive strength, a VHB double-sided foam tape), so that it may be ensured that the display panel 7 is stably fixed on the middle frame 3. The foam tape 86 has excellent flexibility and good adhesiveness, so that the display panel 7 may be firmly fixed on the middle frame 3, and a sufficient buffering may be provided for the display panel 7 under a vibration condition, so as to prevent the display panel 7 from being damaged due to an external force. Alternatively, a positioning groove 34 for accommodating the foam tape 86 is formed on the middle frame 3, so that the foam tape 86 can be conveniently accommodated and fixed on the middle frame 3, and a connecting operation between the display panel 7 and the middle frame 3 is facilitated.

According to some embodiments of the present disclosure, referring to FIGS. 7 to 10 and 43 to 48, the backlight assembly includes a light source component 5. The light source component 5 is arranged on the bottom plate 11. The light source component 5 includes a plurality of light bars 51, the plurality of light bars 51 are arranged at intervals in an up-down direction, and each light bar 51 extends in a left-right direction. Therefore, through setting the light source component 5 to include the plurality of light bars 51, arranging the plurality of light bars 51 at intervals in the up-down direction, arranging each light bar 51 to extend in the left-right direction, i.e., arranging the light bars 51 transversely (in the left-right direction), since a size of the bottom plate 11 in the up-down direction is significantly lower than a size of the bottom plate 11 in the left-right direction, as compared with the case of arranging the light bars 51 longitudinally (in the up-down direction), the number of the light bars 51 can be significantly reduced. For example, sixteen light bars 51 arranged longitudinally may be reduced to six light bars arranged transversely, which not only can significantly reduce the number of the light bars 51, but also can make the installation of the light bars 51 simpler and more convenient, and the adapter plate used where the light bars 51 are arranged longitudinally may be eliminated (because the number of the light bars 51 arranged longitudinally is greater, the adapter plate is required to electrically connect the light bars 51 to the corresponding circuit board). Alternatively, the light bar 51 may be an LED light bar.

It should be understood that the term "a plurality of" as used herein refers to two or more.

According to some alternative embodiments of the present disclosure, referring to FIGS. 7 to 10, and 43 to 49, the light source component 5 includes light bar connectors 52 for controlling the light bars 51, respectively. The light bar connector 52 may be connected to the left or right side of the light bar 51, for example, the light bar connector 52 may be soldered to the left or right side of the light bar 51, and each light bar 51 may be connected to a corresponding circuit board through the light bar connector 52. The side plate 12 is formed with wiring holes 125 through which the light bar connectors 52 are wired out, so that lamp wires of the light bar connectors 52 may conveniently pass through the wiring holes and be connected to corresponding circuit boards. The wiring holes 125, the light bar connectors 52 and the light bars 51 all have a same number and have a one-to-one correspondence. For example, the numbers of the light bars 51, the light bar connectors 52 and the wiring holes 125 all may be six, and each wiring hole 125 is arranged opposite to the corresponding light bar connector 52, so that a length of a wire harness of the light bar connector 52 is reduced.

Where the curved display module 100 includes the backlight assembly and the backlight assembly includes the first reflective part 611, an avoiding opening 831 for avoiding the light bar connector 52 is formed in the third adhesive layer 83 for connecting and fixing the first reflective part 611 on the light source component 5. The light bar 51 may include a lamp panel 511 and lamp beads 512 arranged on the lamp panel 511. The light bar connector 52 may be arranged on the lamp panel 511, and a control signal of the lamp bead 512 may be conducted to the corresponding circuit board (for example, a light source driving circuit board 41 described below) arranged on the back plate 1 through the light bar connector 52 on the lamp panel 511 via the lamp wire.

Alternatively, referring to FIGS. 43 to 49, a part of the light bar connectors 52 are located at the left side of corresponding light bars 51, and another part of the light bar connectors 52 are located at the right side of corresponding light bars 51. This allows a part of the plurality of wiring holes 125 corresponding to the plurality of light bar connectors 52 to be located in a part of the side plate 12 at the left side of the bottom plate 11, and another part of the plurality of wiring holes 125 to be located in a part of the side plate 12 at the right side of the bottom plate 11, which can avoid the problem of a weakness of a local structure of the back plate 1 due to the wiring holes 125 concentrating on the same side of the back plate 1, and can help to reduce a length of the lamp wire of the light bar connector 52.

For example, in the example in FIGS. 43 to 49, the numbers of the light bars 51, the light bar connectors 52, and the wiring holes 125 are all six, and the six light bars 51 are arranged in the up-down direction. The light bar connectors 52 of three light bars 51 located at the upper part of the bottom plate 11 are all located at the right side of the corresponding light bars 51, and three light bar connectors 52 located at the lower part of the bottom plate 11 are all located at the left side of the corresponding light bars 51. The part of the side plate 12 located at the right side of the bottom plate 11 is formed with three wiring holes 125, and the three wiring holes 125 correspond to the three light bar connectors 52 located at the upper part of the back plate 1, respectively. The part of the side plate 12 located at the left side of the bottom plate 11 is formed with three wiring holes 125, and the three wiring holes 125 correspond to the three light bar connectors 52 located at the lower part of the bottom plate 11, respectively. Thus, the problem of the weakness of the local structure of the back plate 1 due to the wiring holes 125 concentrating at the same side of the back plate 1 can be avoided, which can help to reduce the length of the lamp wire of the light bar connector 52.

According to some alternative embodiments of the present disclosure, referring to FIGS. 43 to 49, the light bar 51 includes a lamp panel 511 and lamp beads 512 arranged on the lamp panel 511, and the lamp panel 511 is made of an FPC base material or an FR4 base material. Where the lamp panel 511 is made of an FPC base material, the lamp panel 511 has lower hardness and better flexibility; where the lamp panel 511 is made of an FR4 base material, the lamp panel 511 may have a high structural strength. Further, the overall flexibility, hardness, rigidity, or the like, of the light bar 51 may be adjusted by adjusting a thickness, a width, or the like, of the lamp panel 511. For example, the FR4 base material with s small thickness may be selected to manufacture the lamp panel 511. The thickness of the lamp panel 511 may be in a range of 0.8 mm to 1.2, for example, the thickness of the lamp panel 511 may be 1.0 mm. After the thickness of the lamp panel 511 is determined, the hardness of the light bar 51 may be reduced by reducing the width of the lamp panel 511, the light bar 51 may be ensured to be bent along the curvature of the back plate 1, and the interference of the light bar 51 to the curvature of the back plate 1 may be reduced. For example, where the lamp panel 511 is made of the FR4 base material, the FR4 base material with a thickness of 1.0 mm may be selected to manufacture the lamp panel 511, and the FR4 base materials with a width of 25 mm and 41 mm are selected to manufacture the lamp panels 511. For example, where the light bars 51 are arranged in six rows, the width of the lamp panel 511 located at the uppermost end and the lowermost end may be 41 mm, and the width of the middle four lamp panels 511 may be 25 mm.

According to some alternative embodiments of the present disclosure, the bottom plate 11 has a contour reference 112 for positioning the light bar 51, and the contour reference 112 may be of a convex structure. Where the contour reference 112 is a convex structure, the contour reference 112 may have a height in a range of 0.4 mm to 0.6 mm, for example, the contour reference 112 may have a height of 0.5 mm. With the provided contour reference 112, the light bar 51 is conveniently and accurately connected and fixed at the corresponding position on the back plate 1.

Figure 36:
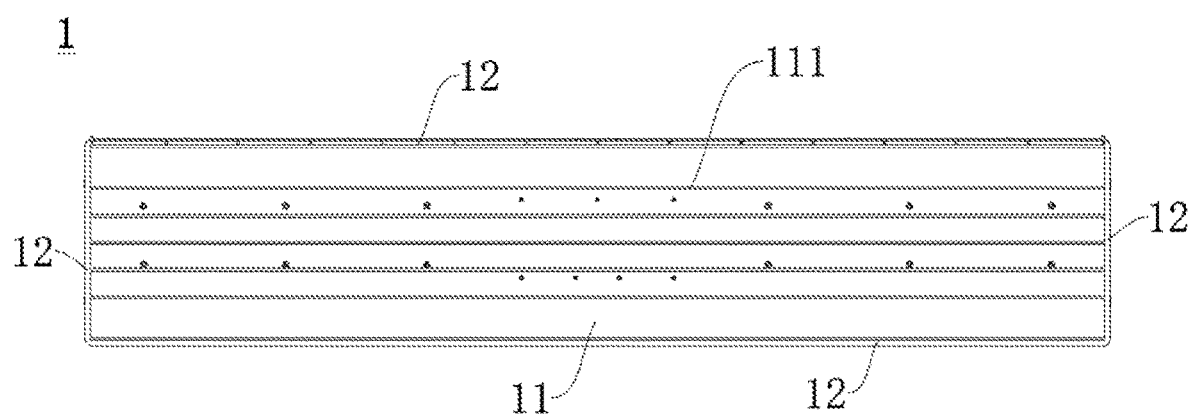
FIG. 36 is a back view of a back plate of the curved display module in FIG. 1.
Figure 37:
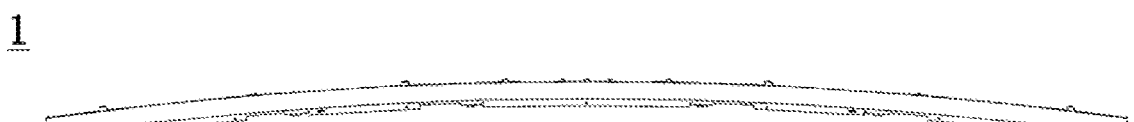
FIG. 37 is a top view of a back plate of the curved display module in FIG. 1.
Figure 38:
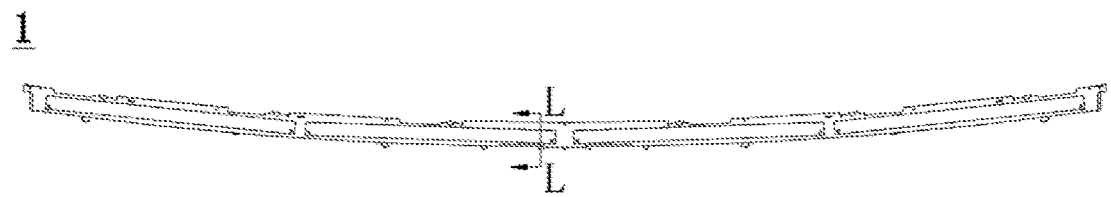
FIG. 38 is a bottom view of a back plate of the curved display module in FIG. 1.
Figure 39:
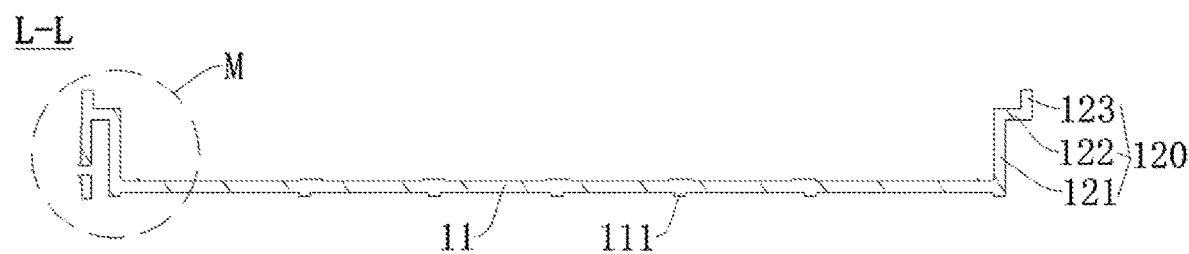
FIG. 39 is a cross-sectional view taken along a line L-L in FIG. 38.
Figure 40:
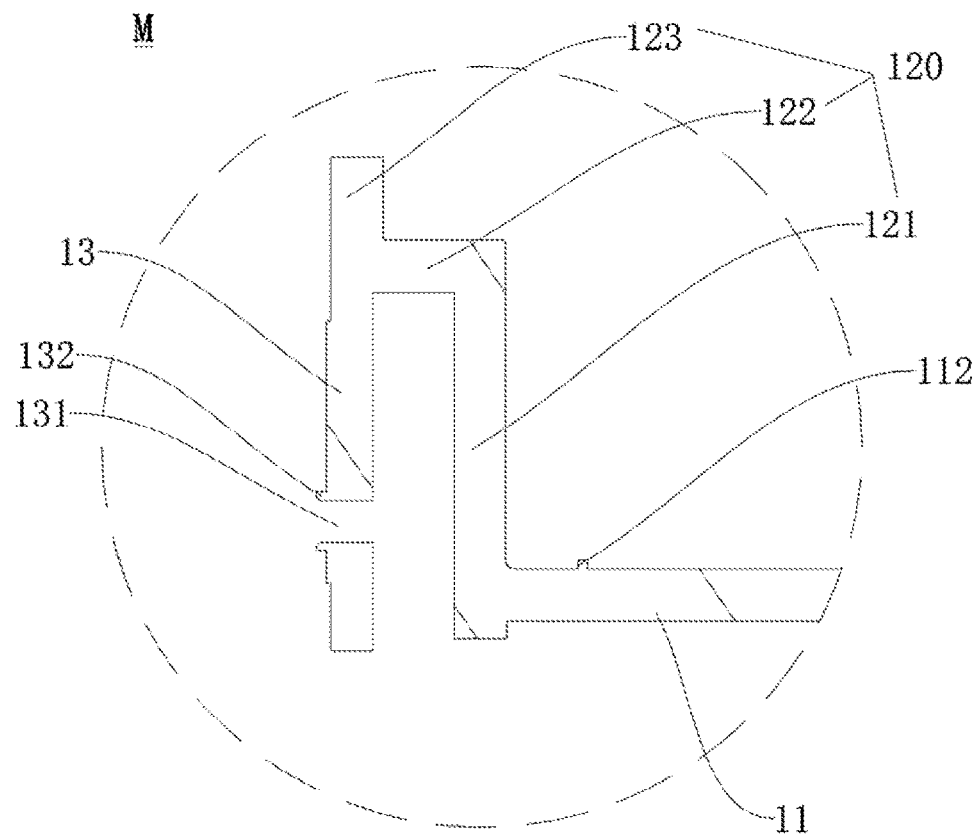
FIG. 40 is an enlarged view of a part M in FIG. 39.
Figure 41:
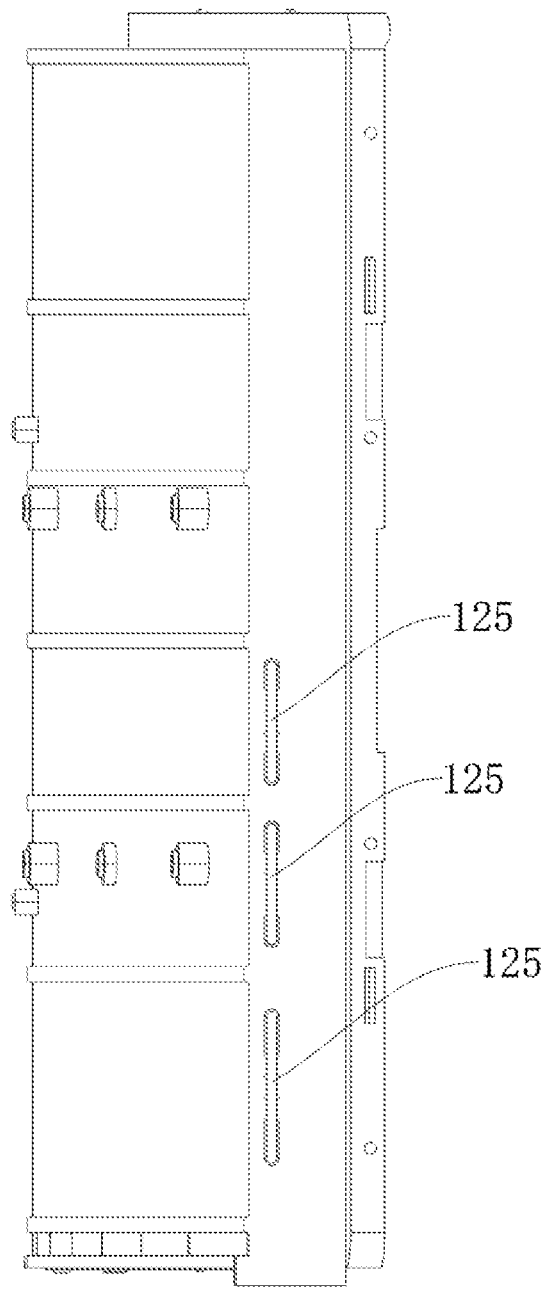
FIG. 41 is a left side view of a back plate of the curved display module in FIG. 1.
Figure 42:
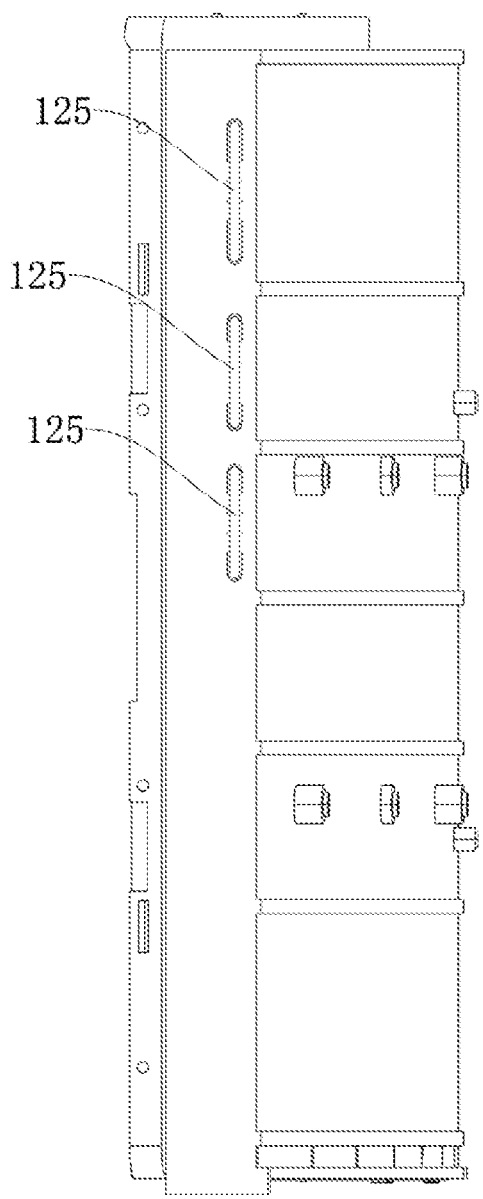
FIG. 42 is a right side view of a back plate of the curved display module in FIG. 1.
Figure 43:
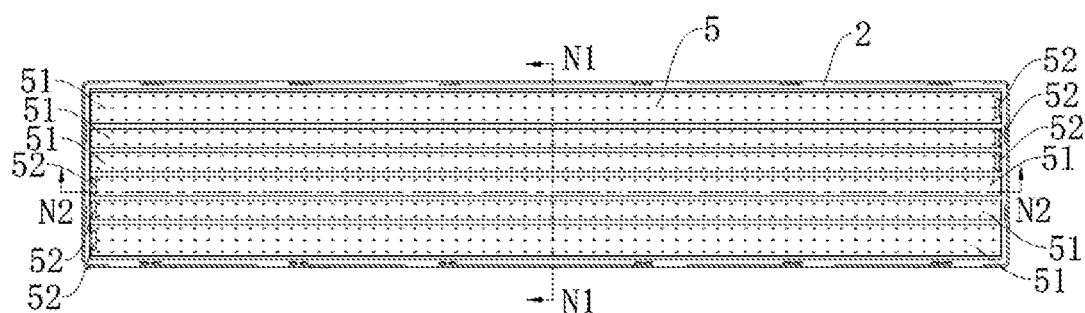
FIG. 43 is a schematic view of the curved display module in FIG. 1 with a light source component installed on a back plate.
Figure 44:
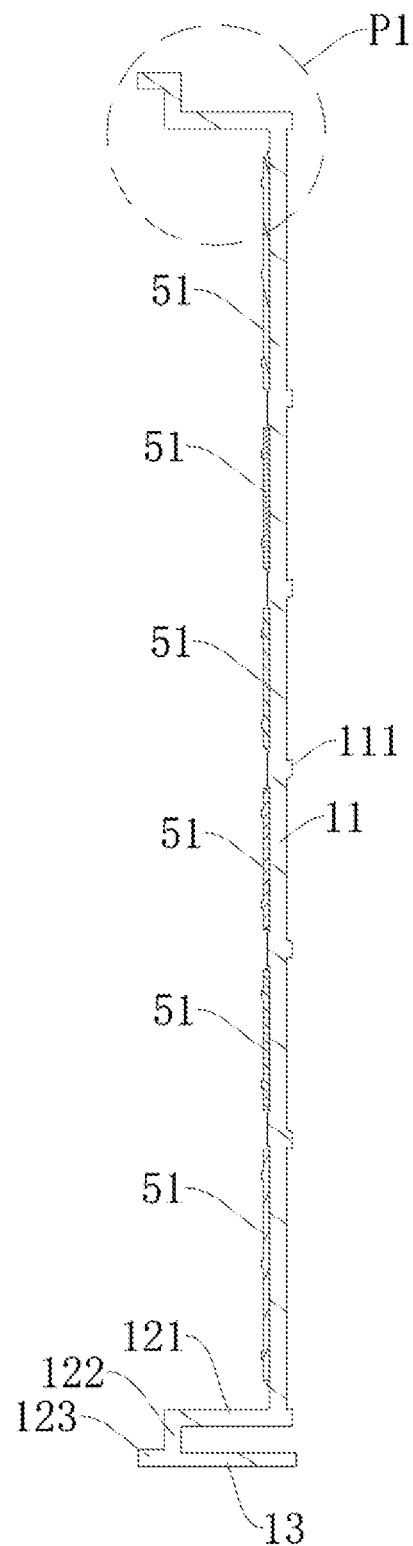
FIG. 44 is a cross-sectional view taken along a line N1-N1 in FIG. 43.
Figure 45:
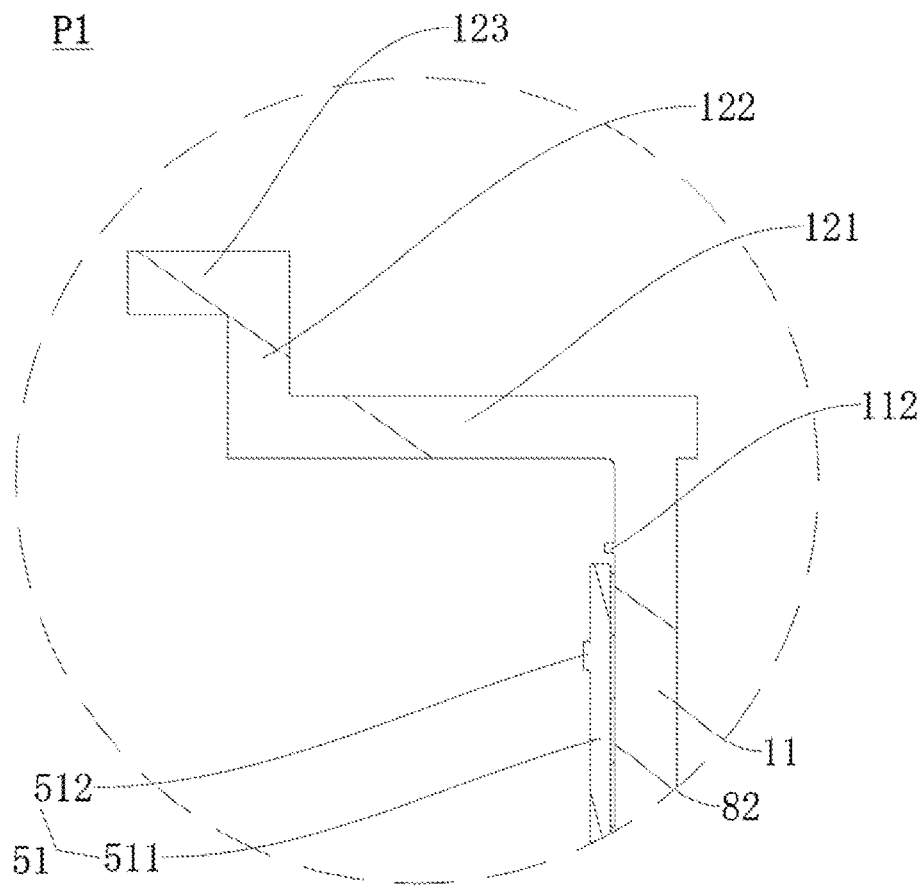
FIG. 45 is an enlarged view of a part P1 in FIG. 44.
Figure 46:
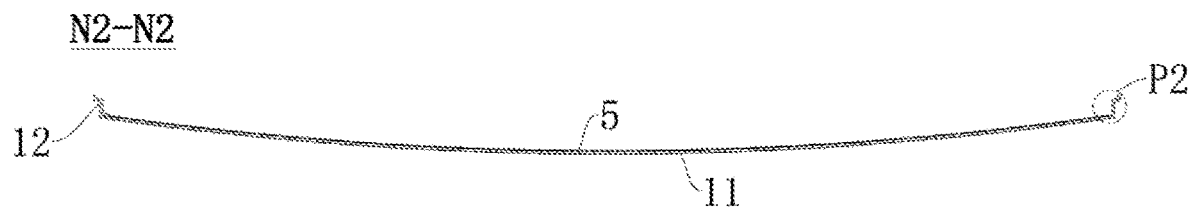
FIG. 46 is a cross-sectional view taken along a line N2-N2 in FIG. 43.
Figure 47:
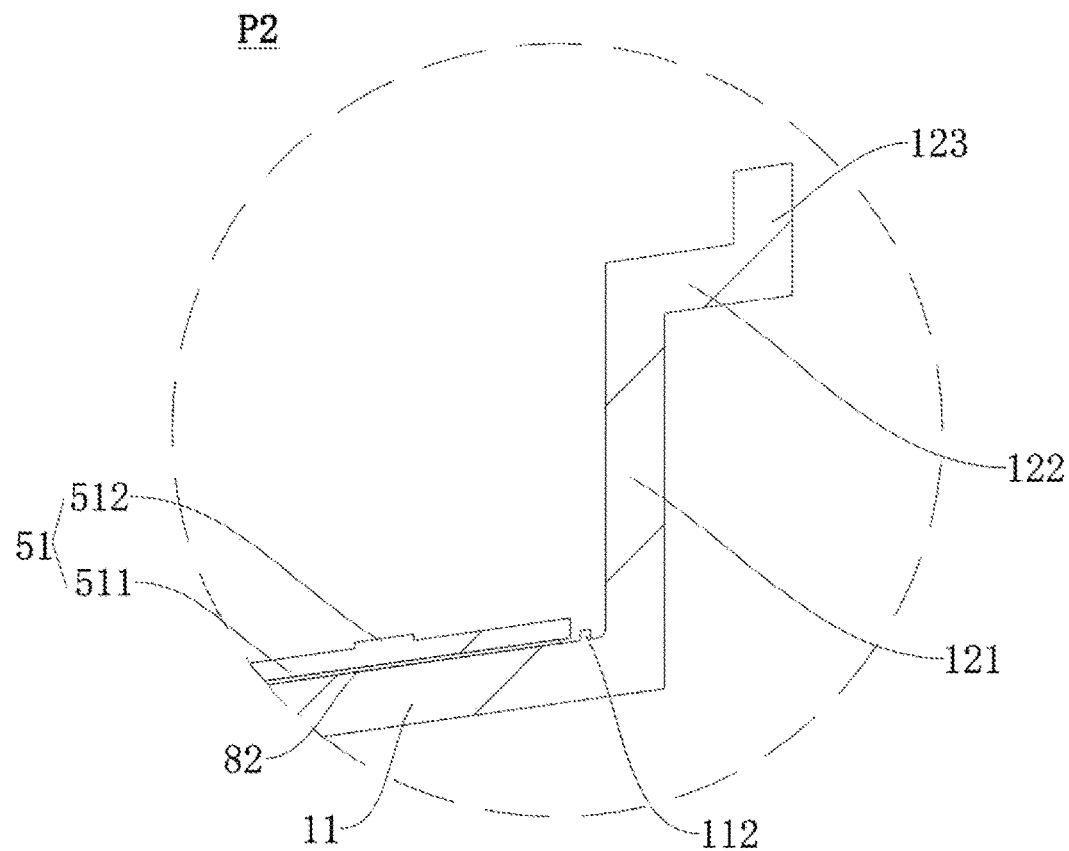
FIG. 47 is an enlarged view of a part P2 in FIG. 46.
Figure 48:
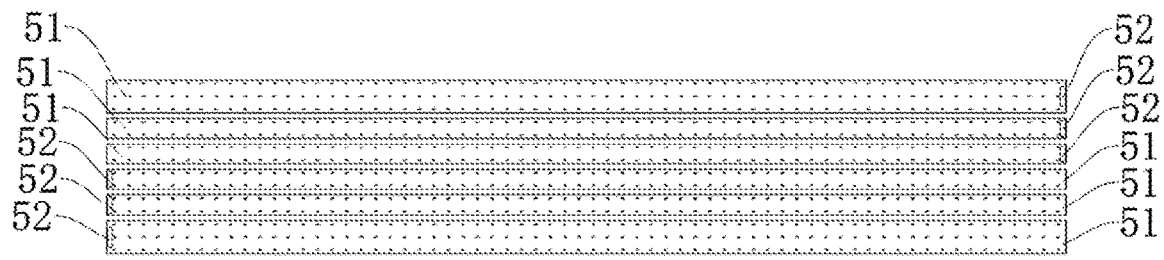
FIG. 48 is a schematic view of a light source component of the curved display module in FIG. 1.
Figure 49:
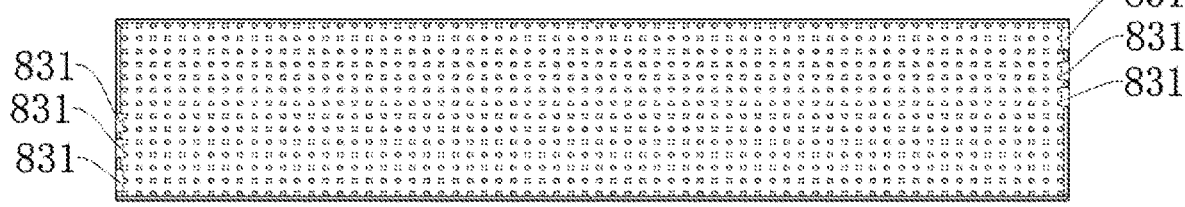
FIG. 49 is a schematic view of a third adhesive layer of the curved display module in FIG. 1.
Figure 50:
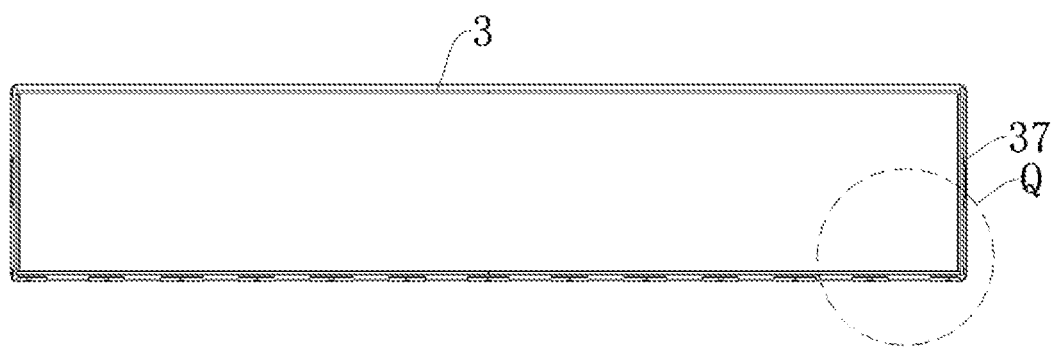
FIG. 50 is a front view of a middle frame of the curved display module in FIG. 1.
Figure 51:
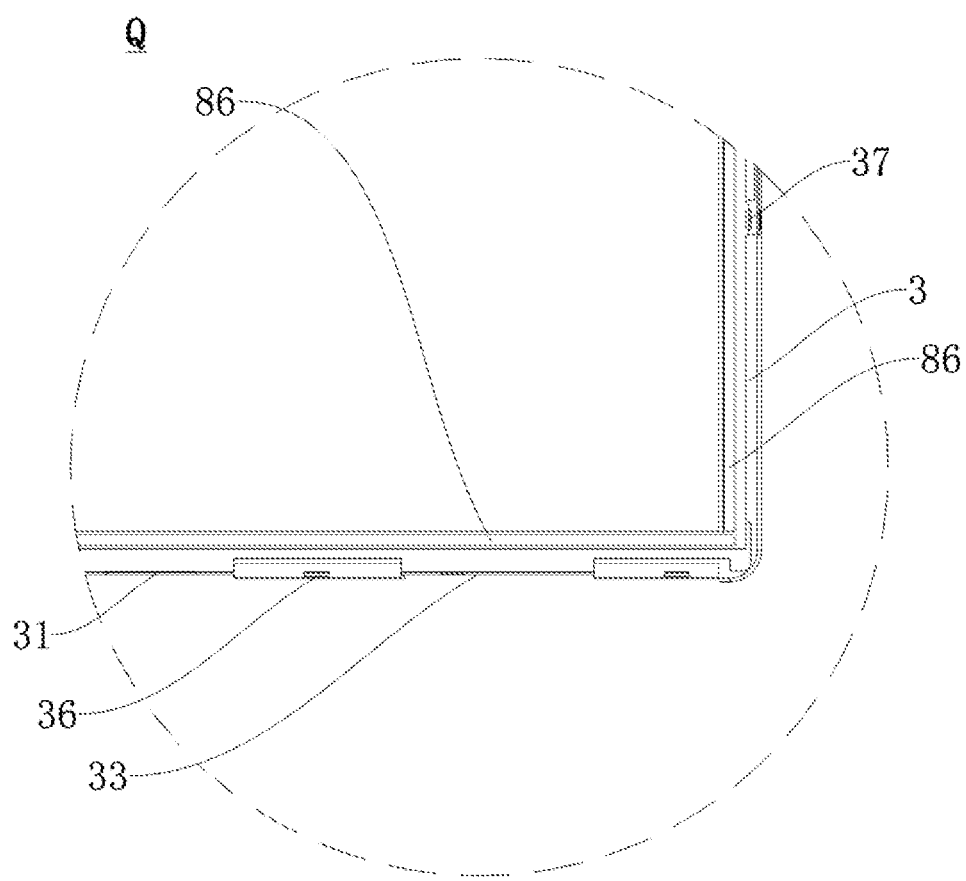
FIG. 51 is an enlarged view of a part Q in FIG. 50.
Figure 52:
FIG. 52 is a back view of a middle frame of the curved display module in FIG. 1.
Figure 53:
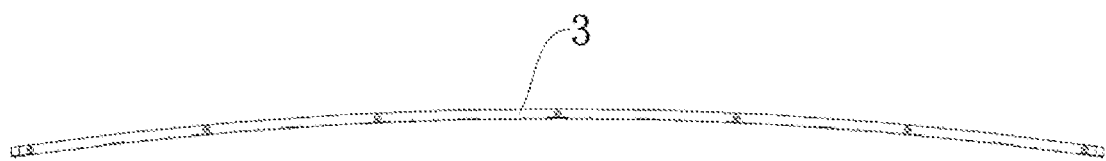
FIG. 53 is a top view of a middle frame of the curved display module in FIG. 1.
Figure 54:
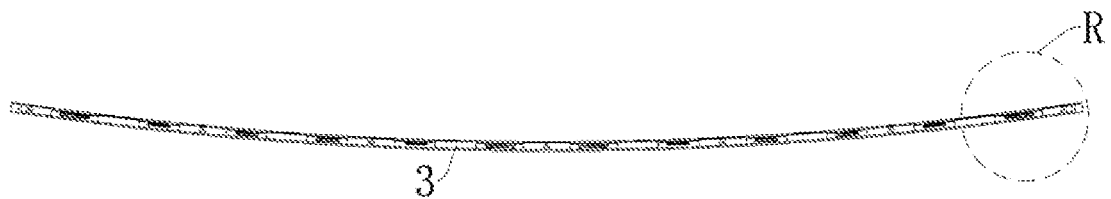
FIG. 54 is a bottom view of a middle frame of the curved display module in FIG. 1.
Figure 55:
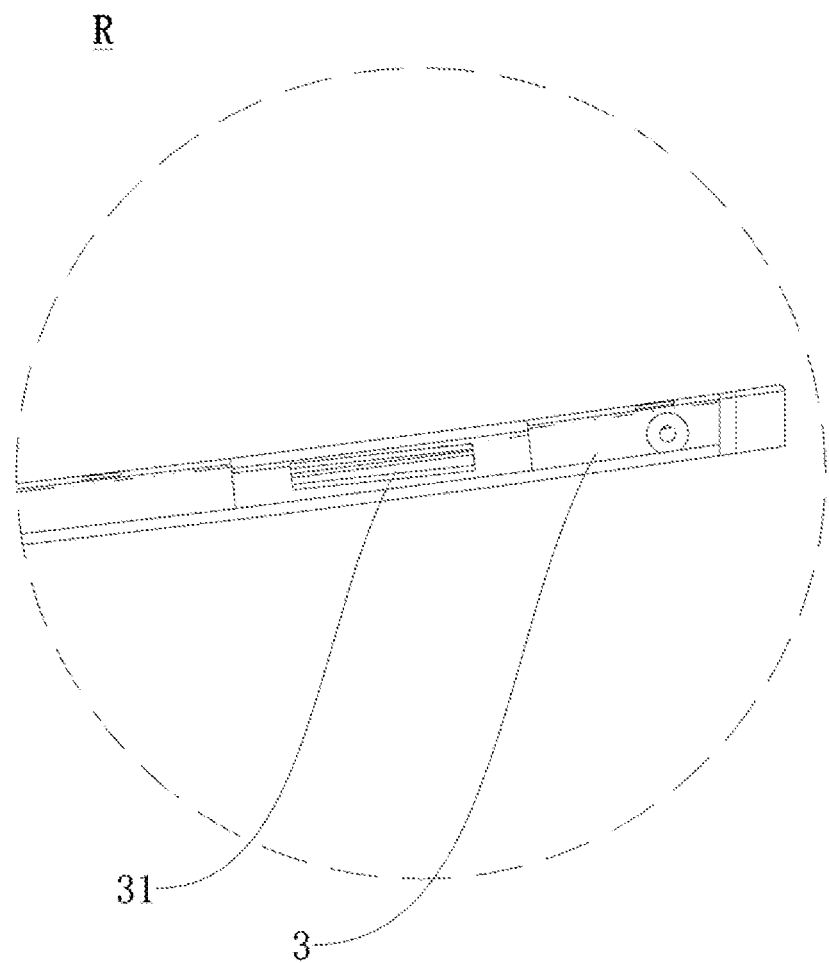
FIG. 55 is an enlarged view of a part R in FIG. 54.
Figure 56:
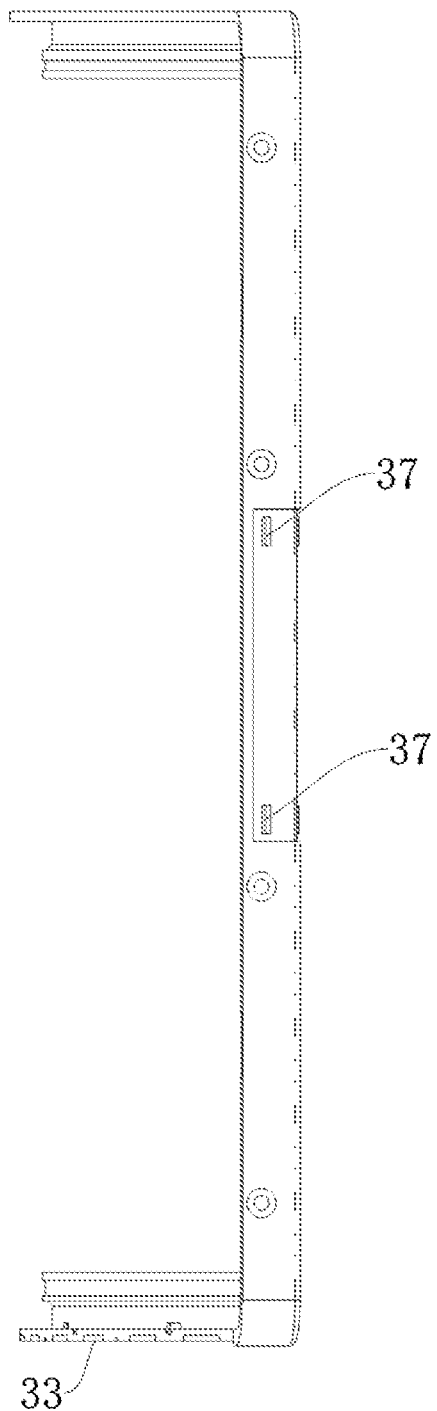
FIG. 56 is a right side view of a middle frame of the curved display module in FIG. 1.

According to some embodiments of the present disclosure, referring to FIGS. 36 and 39, the bottom plate 11 is provided with a reinforcing rib 111, and the reinforcing rib 111 is located on a side of the bottom plate 11 away from the display panel 7. Through arranging the reinforcing ribs 111 on the bottom plate 11, the bottom plate 11 with a smaller thickness has a higher structural strength, so that the requirements on the structural strength may be met, and meanwhile, the back plate 1 has better bending performance. Further, through adjusting parameters such as the height of the reinforcing rib 111 and the width of the reinforcing rib 111, the curvature of the back plate 1 can be corrected, and the curvature precision and the stability of the back plate 1 can be ensured.

According to some alternative embodiments of the present disclosure, referring to FIGS. 36 and 39, a plurality of reinforcing ribs 111 are provided (for example, the number of the reinforcing ribs 111 may be five), the plurality of reinforcing ribs 111 are arranged at intervals in the up-down direction, and each reinforcing rib 111 extends in the left-right direction. Therefore, the structural strength of the back plate 1 may be improved, and the back plate 1 as a whole has better bending performance.

Alternatively, the height of the reinforcing rib 111 is in a range of 0.5 mm to 1.5 mm, the width of the reinforcing rib 111 is in a range of 2.0 mm to 4.0 mm. The height of the reinforcing rib 111 refers to a height of the reinforcing rib 111 protruding from the bottom plate 11, and the width of the reinforcing rib 111 refers to a width of the reinforcing rib 111 in the up-down direction. Therefore, through setting the height of the reinforcing rib 111 and the width of the reinforcing rib 111 within the above ranges, respectively, it is possible to ensure that the structural strength of the back plate 1 meets the requirements, and the back plate 1 as a whole has good bending performance. For example, the curvature of the back plate 1 may be corrected by adjusting the mold structure according to the condition of the curvature deformation of the back plate 1 during the molding process. When the back plate 1 shrinks inward, the heights of the reinforcing ribs 111 at the left side and the right side may be properly increased, and the shrinking inward of the back plate 1 is corrected by increasing the internal stress of the external reinforcing ribs 111 on the back plate 1. When the back plate 1 spreads outward, the heights of the reinforcing ribs 111 at the left side and the right side may be properly reduced, and the spreading outward of the back plate 1 is corrected by reducing the internal stress of the external reinforcing ribs 111 on the back plate 1. Through the adjustment described above, the curvature precision of the back plate 1 can reach 1.125% (where the curvature radius of the back plate 1 is 4200 mm, the tolerance is ±0.5 mm).

According to some embodiments of the present disclosure, the back plate 1 is an aluminum alloy member or a magnesium alloy member. Therefore, under the condition that the thickness of the back plate 1 is less, the structural strength may be high, the back plate 1 has good bending performance, the weight of the back plate 1 is less, and the weight of the curved display module 100 is less.

According to some embodiments of the present disclosure, the back plate 1 may be a one-piece member. Therefore, the processing and forming of the back plate 1 are facilitated, and the curvature precision of the back plate 1 is also conveniently controlled.

Alternatively, the back plate 1 may be a die cast. The back plate 1 formed through the die casting process has a higher curvature precision and a better stability. For example, the back plate 1 may be an aluminum alloy die cast or a magnesium alloy die cast. The aluminum alloy material or the magnesium-aluminum alloy material suitable for the die casting process may be adopted, and may be selected according to application scenes. The magnesium-aluminum alloy material has a low density, a light weight, a high hardness and a high cost of a forming die, and is suitable for the field of military display or aviation. The aluminum alloy material has a high softness, a better fluidity, and a relatively lower cost of the die, and is suitable for conventional field of vehicle-mounted or commercial display. For example, an aluminum alloy material with a thickness of 3.0 mm may be selected for die casting to form the back plate 1.

The back plate 1 is formed through die casting, compared with the back plate 1 formed through stamping, the forming precision of the back plate 1 formed through die casting can be effectively improved, a resilience of the curvature of the back plate 1 can be reduced, and the curvature optimization of the back plate 1 can be realized. For example, the curvature precision of the back plate 1 formed through die casting can reach 1.125% and the tolerance can reach ±0.5 mm, while the curvature precision of the back plate 1 formed through stamping is 1.575% and the tolerance is ±0.7 mm. Therefore, where the back plate 1 is formed through die casting, the curvature precision and the stability of the back plate 1 can be obviously improved. A design value of a die for die casting the back plate 1 is a mid-value of the back plate 1, the die casting process has the characteristics of uniform shrinkage, and is not similar to the stamping process where resilience deformation stress always exists so that the forming of the stamping mould must be designed according to an upper limit of the curvature of the back plate 1. Moreover, a control of the curvature of the die casted back plate 1 may be realized through adjusting the die structure. As described above, when the back plate 1 shrinks inward, the heights of the reinforcing ribs 111 on the back of the back plate 1 at the left side and the right side may be increased to increase the stress of the reinforcing ribs 111; when the back plate 1 spreads outward, the heights of the reinforcing ribs 111 on the back of the back plate 1 at the left side and the right side may be reduced to reduce the stress of the reinforcing ribs 111. The version of a structure of the die is determined after the curvature adjustment work is accomplished, and the control of the curvature of the back plate 1 is reliable and stable. With the stamping process the above adjustment may only be achieved through later shaping, and the shaping engineering has a risk of tolerance deviation and needs regular correction.

A curved display module 100 according to an embodiment of the present disclosure is described below with reference to FIGS. 1 to 57.

Figure 57:
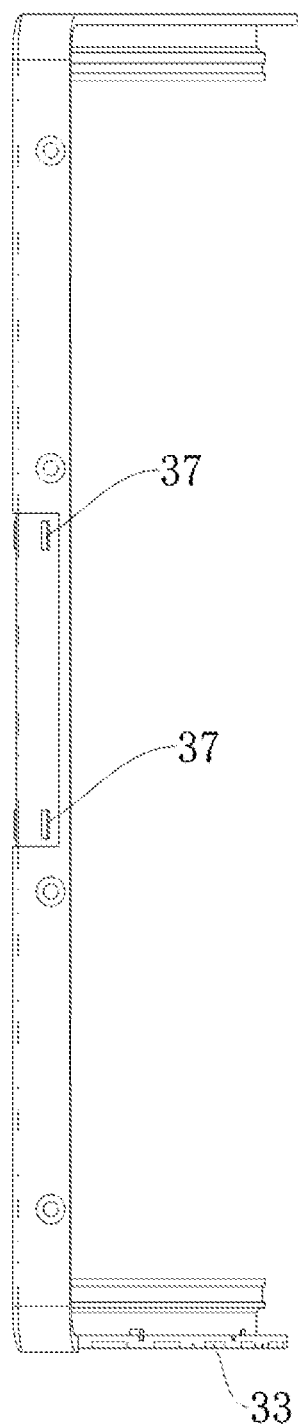
FIG. 57 is a left side view of a middle frame of the curved display module in FIG. 1.

Referring to FIGS. 1 to 57, in the present embodiment, the curved display module 100 includes a back plate 1, a display panel 7, a display panel circuit board 21, a middle frame 3, a first protective cap 22, a source-chip on film 23, a second protective cap 26, a gate-chip on film 24, a third protective cap 25, a backlight assembly, a light source driving circuit board 41, a signal driving circuit board 42, a fourth protective cap 43 and a fifth protective cap 44. The first protective cap 22 and the second protective cap 26 are a same protective cap.

The display panel circuit board 21 and the first protective cap 22 are both arranged at the ground side of the back plate 1, the middle frame 3 is arranged on a side of the back plate 1 close to the display panel 7, and the display panel 7 is connected to the middle frame 3. The back plate 1 includes a bottom plate 11 and a side plate 12, the side plate 12 includes the above-mentioned support part 120 and circuit board fixing part 13, the support part 120 is formed at the outer periphery of the bottom plate 11, the support part 120 surrounds the bottom plate 11, the support part 120 is located at a side of the bottom plate 11 close to the display panel 7, the bottom plate 11 and the support part 120 may be arranged approximately perpendicular to each other, the backlight assembly is arranged in the accommodating space 10 defined by the bottom plate 11 and the support part 120 together, the display panel 7 is arranged on a side of the side plate 12 away from the bottom plate 11, the display panel 7 is located on a side of the backlight assembly away from the bottom plate 11, the backlight assembly may provide a light source for the display panel 7, the circuit board fixing part 13 is connected to the ground side of the support part 120, at least a part of the circuit board fixing part 13 is spaced apart from the support part 120, and the circuit board fixing part 13 may be arranged approximately parallel to at least a part of the support part 120.

The support part 120 includes a first support sub-part 121, a second support sub-part 122 and a middle frame fixing part 123. One end of the first support sub-part 121 is connected to the bottom plate 11, and the other end of the first support sub-part 121 extends in a direction approaching the display panel 7. The first support sub-part 121 may be arranged perpendicular to the bottom plate 11. The circuit board fixing part 13 is located at an outer side of the first support sub-part 121, the circuit board fixing part 13 is arranged opposite to and spaced apart from the first support sub-part 121, and the circuit board fixing part 13 and the first support sub-part 121 may be arranged parallel to each other. One end of the second support sub-part 122 is connected to the other end of the first support sub-part 121, the other end of the second support sub-part 122 extends outward and is connected to the circuit board fixing part 13. The second support sub-part 122 may be arranged perpendicular to both the first support sub-part 121 and the circuit board fixing part 13, the second support sub-part 122 may be arranged substantially parallel to the bottom plate 11, and the second support sub-part 122 may serve for connecting the first support sub-part 121 and the circuit board fixing part 13 together, so that the ground side of the back plate 1 forms a double-wall structure. Through setting the support part 120 to include the first support sub-part 121 and the second support sub-part 122 described above, the support and fixation of a part of the structure of the backlight assembly may be conveniently achieved. The middle frame fixing part 123 is arranged at a side of the second support sub-part 122 close to the display panel 7, and is connected to a side of the second support sub-part 122 away from the first support sub-part 121, and the middle frame fixing part 123 extends in a direction approaching the display panel 7.

The back plate 1 is formed as a one-piece through a die casting process, and the back plate 1 is an aluminum alloy die casting piece or a magnesium alloy die casting piece. The die casting process of the back plate 1 determines that four sides of the back plate may be bent at 90 degrees continuously in a closed manner to form the side plate 12 and other complex structures. The stamping and bending process cannot meet this requirement, in the stamping and bending process, the problem of tearing during stamping cannot be avoided unless the bending surface has an enough gentle slope angle when forming the four-side continuous structure, therefore a closed structure at 90 degrees cannot be formed.

The middle frame 3 is connected and fixed to the middle frame fixing part 123, the middle frame 3 may be fixed to the back plate 1 through a snap hook plus a fastener. For example, a first snap hook 35 is formed on the middle frame 3, and a second snap hook 1231 in snap-fit with the first snap hook 35 is formed on the middle frame fixing part 123. When the middle frame 3 is installed and fixed to the back plate 1, the middle frame 3 may be preliminarily installed to the back plate 1 through the fit between the first snap hook 35 and the second snap hook 1231, and then the middle frame 3 is reliably fixed to the back plate 1 through a first fastener 91 (for example, a screw).

The display panel circuit board 21 and the first protective cap 22 are both arranged at the outer side of the circuit board fixing part 13, the source-chip on film 23 is arranged at the ground side of the middle frame 3, and the first protective cap 22 covers the display panel circuit board 21 and the source-chip on film 23. The first protective cap 22 is connected to both the middle frame 3 and the circuit board fixed part 13 of the back plate 1, and the first protective cap 22 is connected to the middle frame 3 through a snap hook plus a fastener. For example, a third snap hook 36 may be formed on the middle frame 3, and a first snap hole 2221 matching the third snap hook 36 may be formed in the first protective cap 22. When the display panel circuit board 21, the source-chip on film 23 and the first protective cap 22 are connected and fixed to the circuit board fixing part 13 of the back plate 1 and the middle frame 3, the first protective cap 22 may be preliminarily installed to the middle frame 3 through the fit between the third snap hook 36 and the first snap hole 2221, the first protective cap 22 is connected to the middle frame 3 through a second fastener 92, and the first protective cap 22 is connected to the display panel circuit board 21 and the back plate 1 through a third fastener 93, so that the display panel circuit board 21, the source-chip on film 23 and the first protective cap 22 may be connected and fixed to the back plate 1 and the middle frame 3.

The first protective cap 22 includes the protective part 221, the first flanging 222 and the second flanging 223 described above, the protective part 221 is located at the ground side of the side plate 12 and the ground side of the middle frame 3, the first protective cap 22 may be connected to both the back plate 1 and the middle frame 3, the first flanging 222 is located at the front side of the protective part 221, the first flanging 222 abuts against the front side of the middle frame 3, the second flanging 223 is located at the back side of the protective part 221, and the second flanging 223 abuts against the back side surface of the circuit board fixing part 13.

Both the gate-chip on film 24 and the third protective cap 25 are arranged on the left side and the right side of the middle frame 3, the third protective cap 25 may be U-shaped, both the left side and the right side of the middle frame 3 are arranged with the gate-chip on film 24 and the third protective cap 25, the third protective cap 25 covers the corresponding gate-chip on film 24, and each third protective cap 25 may be connected to the middle frame 3 through a snap hook structure. For example, the middle frame 3 may be formed with a fourth snap hook 37, and the third protective cap 25 may be formed with a second snap hole 251 matching the fourth snap hook 37. Alternatively, each third protecting cover 25 may be connected to the middle frame 3 by a plurality of fourth snap hooks 37 (e.g., four fourth snap hooks 37), and the plurality of fourth snap hooks 37 may be divided into a plurality of groups, each group includes two fourth snap hooks 37 arranged opposite to each other, to ensure that the third protecting cover 25 is firmly installed on the middle frame 3.

The backlight assembly includes a light source component 5, a reflector 61, a first optical film 62 and a second optical film 63. The reflector 61 includes a first reflective part 611 and a second reflective part 612. The light source component 5 is arranged on the bottom plate 11. The first reflective part 611 is arranged on the light source component 5 and is located on a side of the light source component 5 away from the bottom plate 11. The second reflective part 612 is arranged on the first support sub-part 121. The first optical film 62 is arranged on the second support sub-part 122, and the second optical film 63 is arranged on a side of the first optical film 62 close to the display panel 7. A positioning pillar 124 is formed on a side of the second support sub-part 122 close to the display panel 7, and a positioning hole 631 matching the positioning pillar 124 is formed in the second optical film 63. The second optical film 63 may be conveniently installed on the back plate 1 by the fit between the positioning hole 631 in the second optical film 63 and the positioning pillar 124 on the back plate 1.

The light source component 5 is connected to the light source driving circuit board 41, for example, the light bar connector 52 of the light source component 5 may be connected to the light source driving circuit board 41 through a lamp wire. The light source driving circuit board 41 drives and controls the light source component 5 to operate. The signal driving circuit board 42 is electrically connected to the display panel 7, and the signal driving circuit board 42 serves for driving the display panel 7. The light source driving circuit board 41 and the signal driving circuit board 42 are both arranged at the back side of the back plate 1, the light source driving circuit board 41 and the signal driving circuit board 42 are both arranged in a substantially flat plate shape, so that no interference or influence to the curvature of the back plate 1 will occur. A fourth protective cap 43 covers the light source driving circuit board 41 to protect the light source driving circuit board 41, and a fifth protective cap 44 covers the signal driving circuit board 42 to protect the signal driving circuit board 42. The fourth protective cap 43 and the fifth protective cap 44 are also arranged in a substantially flat plate shape, so that no interference or influence to the curvature of the back plate 1 will occur.

In the curved display module 100 of the present embodiment, through arranging the display panel circuit board 21, the first protective cap 22, and the source-chip on film 23 at the ground side of the back plate 1, the influence on the curvature of the module can be significantly reduced. Through setting the ground side of the back plate 1 to be a double-wall structure, the inner wall (the part of the support part 120 located at the ground side of the back plate 1) serves for installing and fixing a part of the structure of the backlight assembly, and the outer wall (the circuit board fixing part 13) serves for installing and fixing the display panel circuit board 21. Through connecting the display panel 7 and the middle frame 3 together, a bezel in the related art is omitted, a zero-bazel design can be realized. Through setting the back plate 1 to have a flanging structure, the lower middle frame in the related art may be omitted, a single middle frame design can be realized, thereby avoiding the interference and the influence of the bezel and the lower middle frame in the related art to the curvature of the module. Through the structural design described above, the curvature precision and the stability of the curved display module 100 can be significantly improved.

A display device according to an embodiment of a second aspect of the present disclosure includes the display module according to the embodiment of the first aspect of the present disclosure.

In the display device according to the embodiment of the present disclosure, through providing the curved display module 100 described above, the requirements on the curvature with a high precision can be met, and the yield of the subsequent process can be ensured.

In the description of this specification, the description with reference to the term "one embodiment", "some embodiments", "an illustrative embodiment", "an example", "a specific example", "some examples", or the like means that a specific feature, structure, material, or characteristic described in connection with the embodiment or example is included in at least one embodiment or example of the present disclosure. In this specification, schematic representations of the above terms do not necessarily refer to the same embodiment or example. Furthermore, the specific feature, structure, material, or characteristic described may be combined in a suitable manner in any one or more embodiments or examples.

While the embodiment of the present disclosure has been shown and described, it will be understood by one of ordinary skill in the art that numerous changes, modifications, substitutions and variations may be made to the embodiment without departing from the principle and spirit of the present disclosure, the scope of which is defined by the claims and their equivalents.

What is claimed is:

1. A curved display module, comprising:
    a back plate, wherein the back plate comprises a bottom plate and a side plate, the side plate is at an outer periphery of the bottom plate, and the bottom plate and the side plate together define an accommodating space to accommodate a backlight assembly;
    a display panel, wherein the display panel is on a side of the backlight assembly away from the bottom plate; and
    a display panel circuit board, wherein the display panel circuit board is electrically connected to the display panel through a flexible circuit board, and the display panel circuit board is at an outer side of the side plate, wherein the side plate comprises:
    a support part, wherein the support part is at the outer periphery of the bottom plate, and the support part and the bottom plate together define the accommodating space; and
    a circuit board fixing part, wherein the circuit board fixing part is connected to an outer side of the support part, at least a part of the circuit board fixing part is spaced apart from the support part, and the display panel circuit board is at an outer side of the circuit board fixing part and fixedly connected to the circuit board fixing part.

2. The curved display module according to claim 1, wherein the display panel circuit board is fixedly connected to the side plate which is arc-shaped, and the bottom plate is arc-shaped.

3. The curved display module according to claim 1, wherein the support part comprises:
    a first support sub-part, wherein one end of the first support sub-part is connected to the bottom plate, the other end of the first support sub-part extends in a direction approaching the display panel, the circuit board fixing part is at an outer side of the first support sub-part, and the circuit board fixing part and the first support sub-part are opposite to and spaced apart from each other; and
    a second support sub-part, wherein one end of the second support sub-part is connected to the other end of the first support sub-part, and the other end of the second support sub-part extends outwards and is connected to the circuit board fixing part.

4. The curved display module according to claim 3, wherein the backlight assembly comprises a second optical film, a positioning pillar is on a side of the second support sub-part close to the display panel, and a positioning hole matching the positioning pillar is in the second optical film.

5. The curved display module according to claim 1, further comprising a first protective cap, wherein at least a part of the first protective cap is at the outer side of the side plate and covers the display panel circuit board.

6. The curved display module according to claim 5, further comprising a middle frame, wherein at least a part of the middle frame is on a side of the back plate close to the display panel, the display panel is on the middle frame, the first protective cap comprises a protective part and a first flanging, the protective part is at the outer side of the side plate and/or an outer side of the middle frame, the first flanging is at a side of the protective part close to the display panel, and the first flanging abuts against a surface of the middle frame close to the display panel.

7. The curved display module according to claim 6, wherein the first protective cap further comprises a second flanging, the second flanging is at a side of the protective part away from the display panel, and the second flanging abuts against a surface of the side plate away from the display panel.

8. The curved display module according to claim 1, wherein a first fixing hole is in the side plate, a second fixing hole corresponding to the first fixing hole is in the display panel circuit board, and a fastener passes through the first fixing hole and the second fixing hole to connect the display panel circuit board to the back plate.

9. The curved display module according to claim 8, wherein the first fixing hole is in the circuit board fixing part.

10. The curved display module according to claim 8, wherein a positioning boss for positioning the display panel circuit board is on the side plate, the positioning boss is around an outer periphery of the first fixing hole, and the positioning boss matches the second fixing hole.

11. The curved display module according to claim 8, further comprising a first protective cap, wherein at least a part of the first protective cap is at the outer side of the side plate and covers the display panel circuit board, a third fixing hole is in the first protective cap, and a fastener passes through the first fixing hole, the second fixing hole and the third fixing hole to connect the display panel circuit board and the first protective cap to the back plate.

12. The curved display module according to claim 1, wherein the backlight assembly comprises a light source component and a reflector, the light source component is on the bottom plate, the reflector comprises a first reflective part and a second reflective part, the first reflective part is on the light source component and on a side of the light source component away from the bottom plate, and the second reflective part is on the side plate.

13. The curved display module according to claim 1, further comprising a chip on film assembly, wherein the chip on film assembly is at the outer side of the side plate and serves for transmitting a driving signal to the display panel.

14. The curved display module according to claim 13, wherein the chip on film assembly comprises a source-chip on film, and the source-chip on film and the display panel circuit board are on a same side of the side plate.

15. The curved display module according to claim 14, further comprising a second protective cap, wherein the second protective cap is at the outer side of the side plate and covers the source-chip on film.

16. The curved display module according to claim 15, wherein a spacer is between the second protective cap and the source-chip on film.

17. The curved display module according to claim 13, wherein the chip on film assembly comprises a gate-chip on film, and the gate-chip on film and the display panel circuit board are on different sides of the side plate, respectively.

18. The curved display module according to claim 17, further comprising a third protective cap, wherein the third protective cap is at the outer side the side plate and covers the gate-chip on film.

19. A display device, comprising the curved display module according to claim 1.

* * * * *